US010477324B2

(12) United States Patent
Cole et al.

(10) Patent No.: US 10,477,324 B2
(45) Date of Patent: Nov. 12, 2019

(54) TEST APPARATUS FOR BINAURALLY-COUPLED ACOUSTIC DEVICES

(71) Applicant: Etymonic Design Incorporated, Dorchester (CA)

(72) Inventors: John W. Cole, Springfield (CA); William A. Cole, Dorchester (CA); Jacobus A. Jonkman, Dorchester (CA); Jonathan M. Pietrobon, London (CA)

(73) Assignee: ETYMONIC DESIGN INCORPORATED, Dorchester (CA)

( * ) Notice: Subject to any disclaimer, the term of this patent is extended or adjusted under 35 U.S.C. 154(b) by 0 days.

(21) Appl. No.: 16/198,067

(22) Filed: Nov. 21, 2018

(65) Prior Publication Data

US 2019/0132684 A1 May 2, 2019

Related U.S. Application Data

(63) Continuation of application No. 15/928,547, filed on Mar. 22, 2018, now Pat. No. 10,171,920, which is a (Continued)

(51) Int. Cl.
*H04R 25/00* (2006.01)

(52) U.S. Cl.
CPC ........... *H04R 25/30* (2013.01); *H05K 999/99* (2013.01); *H04R 25/552* (2013.01)

(58) Field of Classification Search
CPC ......... H04R 5/00; H04R 25/552; H04R 25/30

(Continued)

(56) References Cited

U.S. PATENT DOCUMENTS 6,954,535 B1 * 10/2005 Arndt ..................... H04R 25/70 367/118
7,062,056 B2 * 6/2006 Jonkman ................ H04R 25/30 381/312

(Continued)

FOREIGN PATENT DOCUMENTS

CA 2885980 A1 9/2016

OTHER PUBLICATIONS

Acoustical Society of America, American National Standard, Specification of Hearing Aid Characteristics, pp. 1-54, ANSI/ASA 53.22-2014, Dec. 9, 2014.

(Continued)

*Primary Examiner* — William A Jerez Lora
(74) *Attorney, Agent, or Firm* — Bereskin & Parr LLP

(57) ABSTRACT

A test apparatus for binaurally-coupled acoustic devices is disclosed. The apparatus includes a base, a lid, a primary speaker, and a binaural test fixture. The lid is coupled to the base and movable between a closed position in which the lid and base cooperate to form a closed sound chamber that is symmetric about a vertical mirror plane, and an open position. The primary speaker is coupled to one of the base and the lid, and faces a direction that lies on the mirror plane. The binaural test fixture is positioned inside the sound chamber, and includes first and second acoustic coupler mounts. The vertical mirror plane extends symmetrically between the first and second acoustic coupler mounts. A binaural test fixture, an acoustic coupler assembly, and a method of testing binaurally-coupled acoustic devices are also disclosed.

20 Claims, 16 Drawing Sheets

Related U.S. Application Data continuation of application No. 15/805,839, filed on Nov. 7, 2017, now Pat. No. 9,961,455, which is a continuation of application No. 14/665,457, filed on Mar. 23, 2015, now Pat. No. 9,860,652.

(58) Field of Classification Search
USPC .......................... 381/1, 23.1, 56, 58, 60, 312
See application file for complete search history.

(56) References Cited

U.S. PATENT DOCUMENTS

| | | | | | |
|---|---|---|---|---|---|
| 9,860,652 | B2 | 1/2018 | Cole et al. | | |
| 9,961,455 | B2 | 5/2018 | Cole et al. | | |
| 10,171,920 | B2 | 1/2019 | Cole et al. | | |
| 2003/0063763 | A1* | 4/2003 | Allred | H04R 25/70 | 381/314 |
| 2004/0037428 | A1* | 2/2004 | Keller | A61B 5/121 | 381/60 |
| 2004/0196997 | A1* | 10/2004 | Boonen | H04R 25/30 | 381/322 |
| 2008/0025521 | A1* | 1/2008 | Morise | G01H 3/00 | 381/56 |
| 2009/0147968 | A1* | 6/2009 | Inoda | G10L 21/0208 | 381/94.1 |
| 2010/0128907 | A1* | 5/2010 | Dijkstra | H04R 25/407 | 381/315 |
| 2012/0243697 | A1* | 9/2012 | Frye | H04R 29/00 | 381/58 |
| 2014/0049776 | A1* | 2/2014 | Teraoka | G01J 3/50 | 356/402 |
| 2014/0141724 | A1* | 5/2014 | Liu | H04R 1/1083 | 455/63.1 |
| 2014/0146973 | A1* | 5/2014 | Liu | H04R 29/00 | 381/58 |
| 2016/0286321 | A1 | 9/2016 | Cole et al. | | |
| 2018/0063649 | A1 | 3/2018 | Cole et al. | | |
| 2018/0270589 | A1 | 9/2018 | Cole et al. | | |

OTHER PUBLICATIONS

Alter, Lloyd, "Hearables: Boomers' answer to the hearing aid", Nov. 11, 2014, Retrieved from the Internet on Nov. 2, 2016, http://www.mnn.com/green-tech/gadgets-electronics/stories/hearables-boomers-answer-to-the-hearing-aid.

Hosford-Dunn, Holly, "Hearing Economics", Retrieved from the Internet on Nov. 2, 2016, http://hearinghealthmatters.org/hearingeconomics/2015/medical-device-consumer-electronics-gadget/.

* cited by examiner

TEST APPARATUS FOR BINAURALLY-COUPLED ACOUSTIC DEVICES

FIELD

This disclosure relates to the field of test apparatus for binaurally-coupled devices, binaural test fixtures for carrying binaurally-coupled acoustic devices, acoustic couplers for carrying an acoustic device, and methods of testing binaurally-coupled acoustic devices.

INTRODUCTION

Acoustic devices such as hearing aids may have a microphone and a speaker. The speaker may generate output sound based on the sound detected by the microphone. For example, the detected sound may be amplified to generate the output sound. In some cases, output sound of improved quality may be generated by applying sound processing to the detected sound (e.g. to remove background noise or to amplify specific frequencies). The performance of an acoustic device may be tested in a sound insulated chamber to verify that the acoustic performance meets specification.

SUMMARY

In a first aspect, a test apparatus for binaurally-coupled acoustic devices is provided. The apparatus may comprise a base, a lid, a primary speaker, and a binaural test fixture. The lid may be coupled to the base. The lid may be movable between a closed position in which the lid and base cooperate to form a closed sound chamber that is symmetric about a vertical mirror plane, and an open position. The primary speaker may be coupled to one of the base and the lid. The primary speaker may face a direction that lies on the mirror plane. The binaural test fixture may be positioned inside the sound chamber. The binaural test fixture may include first and second acoustic coupler mounts. The vertical mirror plane may extend symmetrically between the first and second acoustic coupler mounts.

In another aspect, a binaural test fixture for carrying two binaurally-coupled acoustic devices in a test apparatus is provided. The binaural test fixture may comprise a fixture body, first and second acoustic coupler mounts, and first and second output measurement microphones. The fixture body may have a longitudinally and vertically extending lateral centerplane. The first acoustic coupler mount and a first output measurement microphone connected to the fixture body on a first side of the centerplane. The second acoustic coupler mount and a second output measurement microphone may be connected to the fixture body on a second side of the centerplane. Each of the first and second output measurement microphones may face away from the centerplane.

In another aspect, an acoustic coupler assembly for carrying an acoustic device is provided. The acoustic coupler assembly may comprise a coupler body, and an acoustic device speaker mount. The coupler body may extend in length from a lateral outer body end to a lateral inner body end. The body may have a sound test cavity extending laterally between the lateral inner and outer body ends and the sound test cavity may have lateral inner and outer test cavity openings and a laterally extending sound test cavity centerline. The acoustic device speaker mount may cover the lateral outer body end and have a speaker mount opening sized to grasp a speaker of an acoustic device received in the speaker mount opening. The speaker mount opening may abut the lateral outer test cavity opening.

In another aspect, a method of testing binaurally-coupled acoustic devices is provided. The method may comprise: emitting reference sound from a primary speaker facing a reference direction, the reference direction lying in a mirror plane; simultaneously receiving the reference sound at a first device microphone of a first acoustic device and at a second device microphone of a second acoustic device, the first and second device microphones being spaced apart on opposite sides of the mirror plane; receiving the reference sound at a first input reference microphone positioned proximate the first device microphone; receiving first output sound at a first output measurement microphone, the first output sound emitted by the first acoustic device; and receiving second output sound at a second output measurement microphone, the second output sound emitted by the second acoustic device.

DRAWINGS

DESCRIPTION OF VARIOUS EMBODIMENTS

Figure 1:
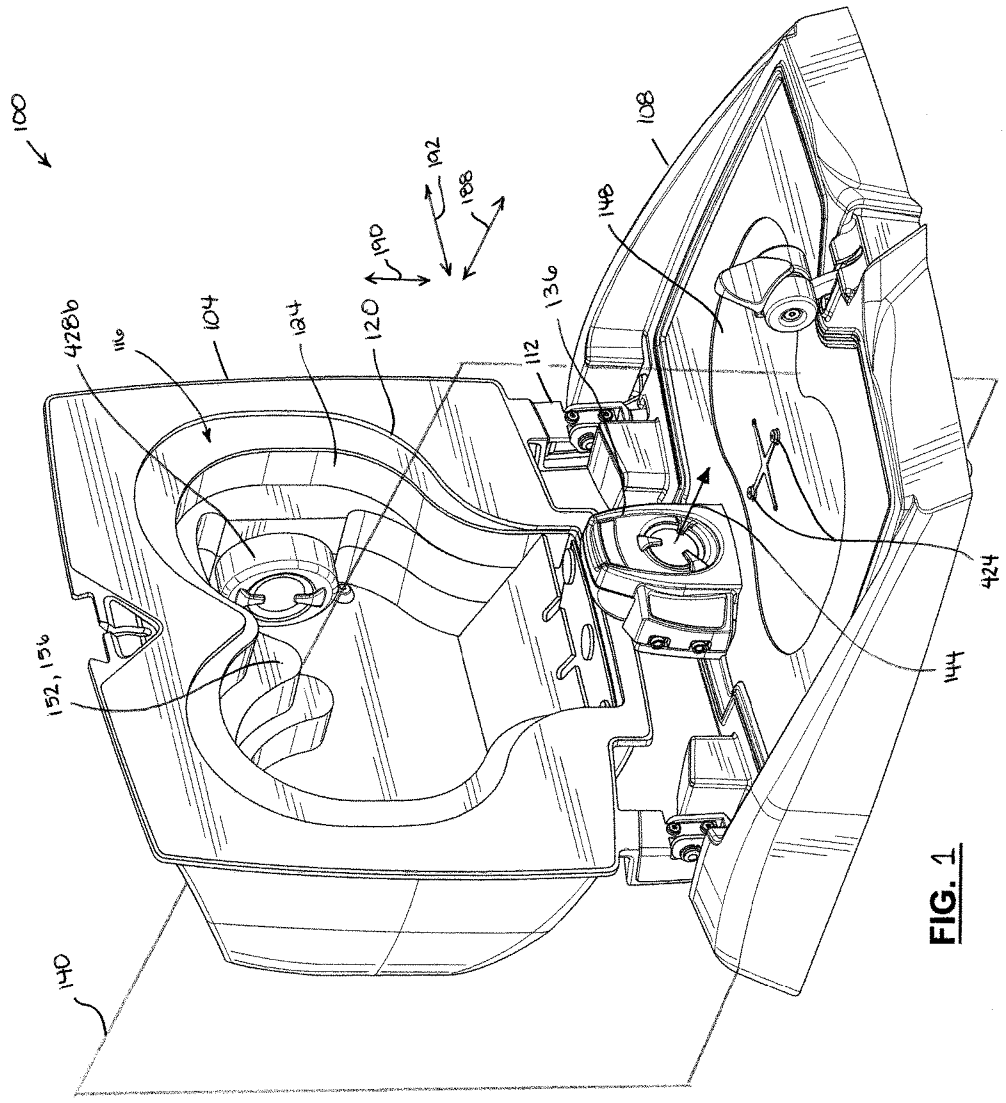
FIG. 1 is a perspective view of a test apparatus without a binaural test fixture, in an open position, in accordance with at least one embodiment.

Many modern acoustic devices, such as hearing aids, operate in binaurally-coupled pairs which cross-communicate signals, signal information or control data to improve performance and convenience. Such acoustic devices may perform differently when tested as a pair than when tested individually. Accordingly, it may be desirable or even necessary to test a binaurally-coupled pair of devices simultaneously as a pair instead of individually.

Testing the acoustic performance of a binaurally-coupled acoustic system requires tightly controlling the acoustic stimulus at the microphone of each acoustic device in order to achieve meaningful results. In some cases, this may be achieved using an anechoic chamber, but for many applications such as clinics, small labs or production facilities a smaller sound chamber may be required because of space constraints.

Further, acoustic devices of a binaurally-coupled pair typically need to be in close proximity to maintain a communications link. For example, binaurally-coupled hearing aids may only be intended to communicate at distances similar to the ear to ear spacing of the human head. Accordingly, close proximity may be necessary for testing some binaurally-coupled acoustic devices.

Numerous embodiments are described in this application, and are presented for illustrative purposes only. The described embodiments are not intended to be limiting in any sense. The invention is widely applicable to numerous embodiments, as is readily apparent from the disclosure herein. Those skilled in the art will recognize that the present invention may be practiced with modification and alteration without departing from the teachings disclosed herein. Although particular features of the present invention may be described with reference to one or more particular embodiments or figures, it should be understood that such features are not limited to usage in the one or more particular embodiments or figures with reference to which they are described.

The terms "an embodiment," "embodiment," "embodiments," "the embodiment," "the embodiments," "one or more embodiments," "some embodiments," and "one embodiment" mean "one or more (but not all) embodiments of the present invention(s)," unless expressly specified otherwise.

The terms "including," "comprising" and variations thereof mean "including but not limited to," unless expressly specified otherwise. A listing of items does not imply that any or all of the items are mutually exclusive, unless expressly specified otherwise. The terms "a," "an" and "the" mean "one or more," unless expressly specified otherwise.

As used herein and in the claims, two or more parts are said to be "coupled", "connected", "attached", or "fastened" where the parts are joined or operate together either directly or indirectly (i.e., through one or more intermediate parts), so long as a link occurs. As used herein and in the claims, two or more parts are said to be "directly coupled", "directly connected", "directly attached", or "directly fastened" where the parts are connected in physical contact with each other. As used herein, two or more parts are said to be "rigidly coupled", "rigidly connected", "rigidly attached", or "rigidly fastened" where the parts are coupled so as to move as one while maintaining a constant orientation relative to each other. None of the terms "coupled", "connected", "attached", and "fastened" distinguish the manner in which two or more parts are joined together.

Figure 2:
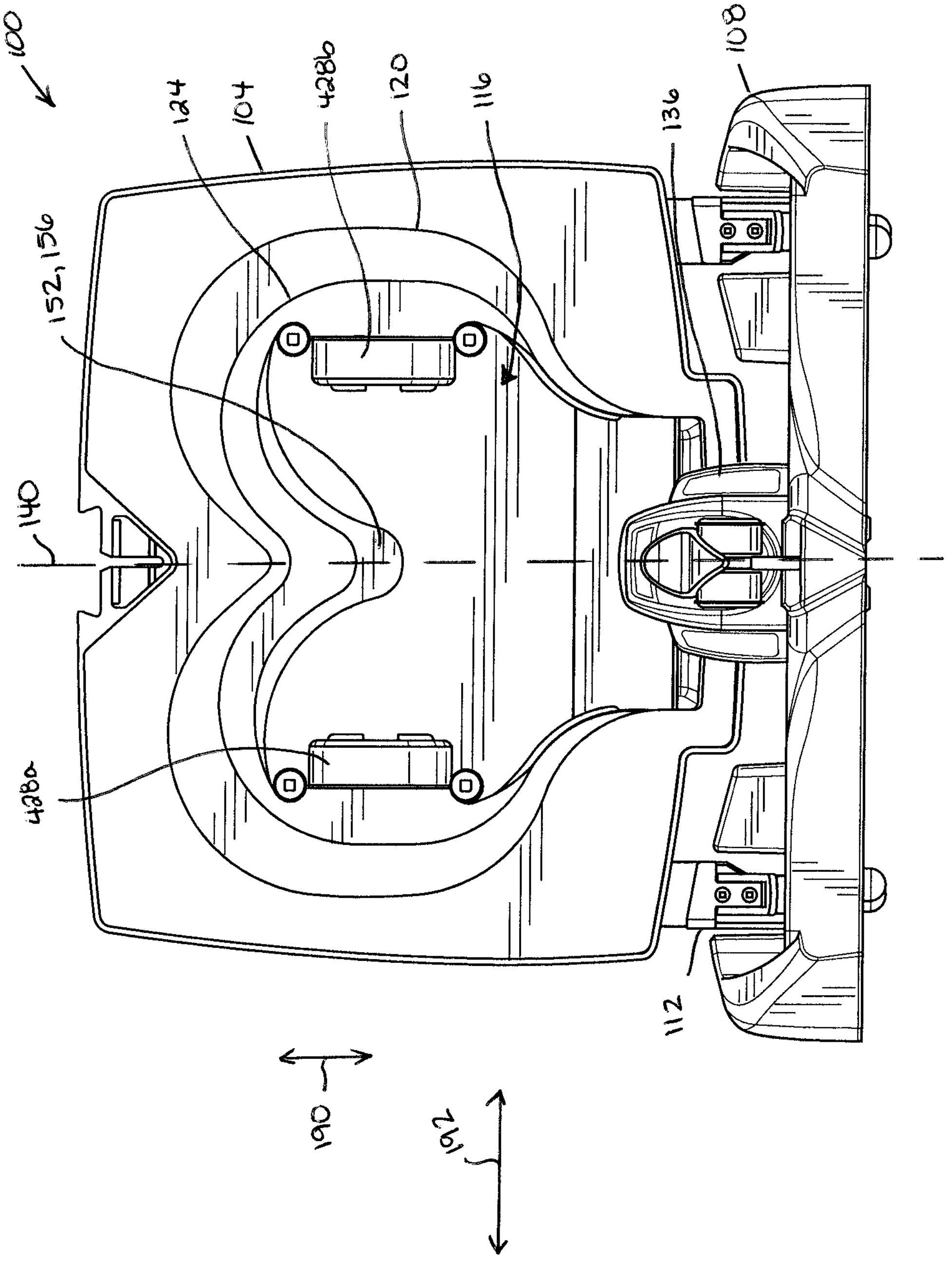
FIG. 2 is a front elevation view of the test apparatus of FIG. 1.

Reference is now made to FIGS. 1 and 2 where a test apparatus 100 for binaurally-coupled acoustic devices is shown in accordance with at least one embodiment. Test apparatus 100 may provide a common sound chamber for holding a pair of binaurally-coupled acoustic devices for simultaneous testing. The sound chamber, as well as the position of the acoustic devices and emission of reference sounds inside the chamber, may be substantially symmetrical about a mirror plane to generate substantially identical sound fields (or as close to identical sound fields as possible) at the microphones of both acoustic devices. Reference microphones may permit error detection and/or correction. This may permit tight control over the acoustic stimulus at the microphone of each acoustic device in order to achieve meaningful test results.

Still referring to FIGS. 1 and 2, test apparatus 100 is shown including a lid 104 and a base 108. Lid 104 may be connected to base 108 and movable between an open position and a closed position. In the closed position, lid 104 and base 108 cooperate to form a closed sound chamber. In the open position, lid 104 and base 108 may be at least partially separated to permit access to add or remove elements from the sound chamber.

Lid 104 may be movably connected to base 108 in any suitable fashion. For example, lid 104 may be entirely separable from base 108 to permit free placement of lid 104 over base 108, or lid 104 may be pivotally connected to base 108 (e.g. by a hinge 112). As shown, lid 104 may include a lid cavity 116 having an open lower cavity end 120. In the closed position, lower cavity end 120 may abut base 108 to close lid cavity 116 to form an enclosed sound chamber defined by base 108 and lid cavity 116.

Figure 3:
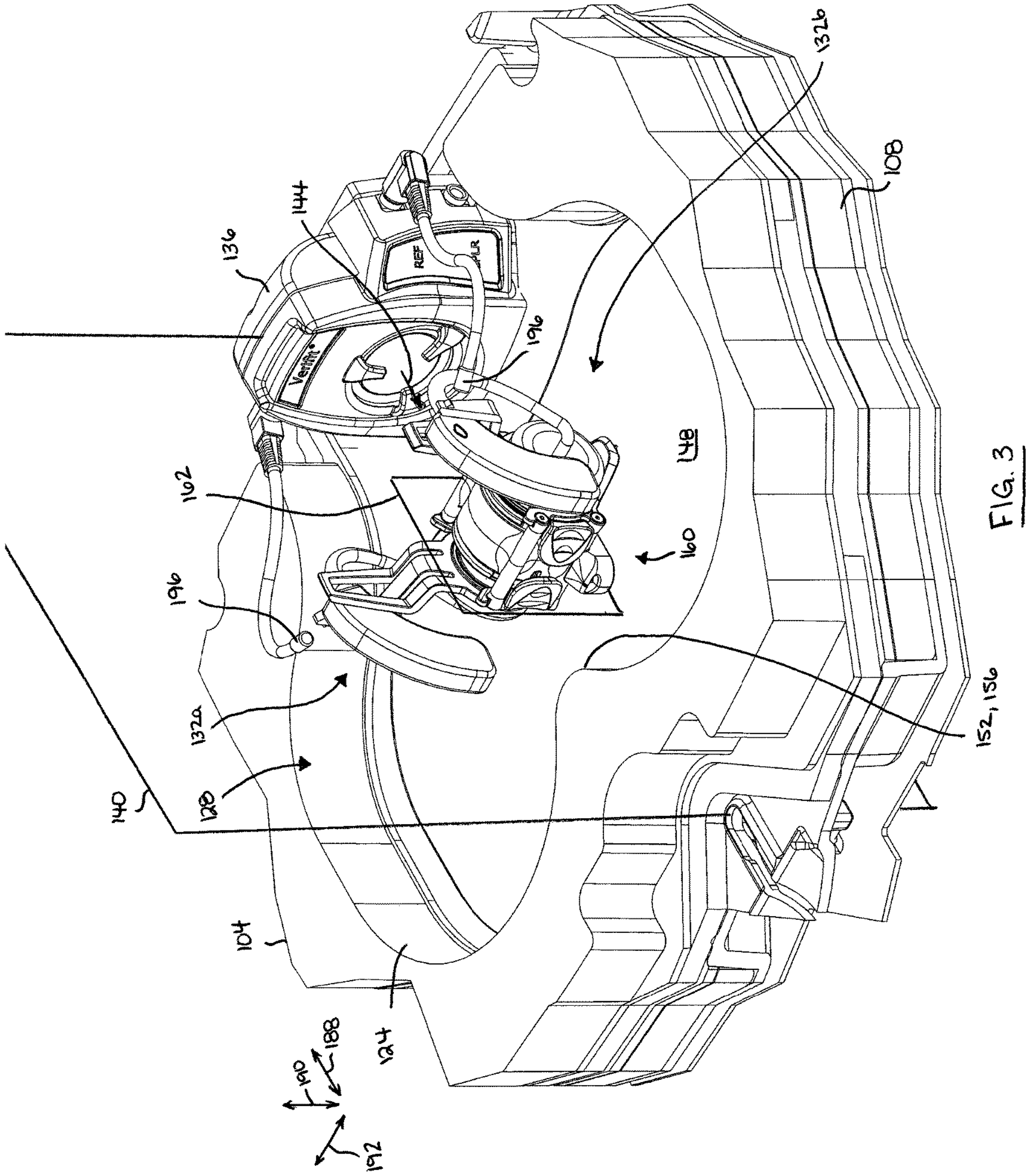
FIG. 3 is a cutaway perspective view of the test apparatus of FIG. 1 with a binaural test fixture and without auxiliary speakers, in a closed position.
Figure 4:
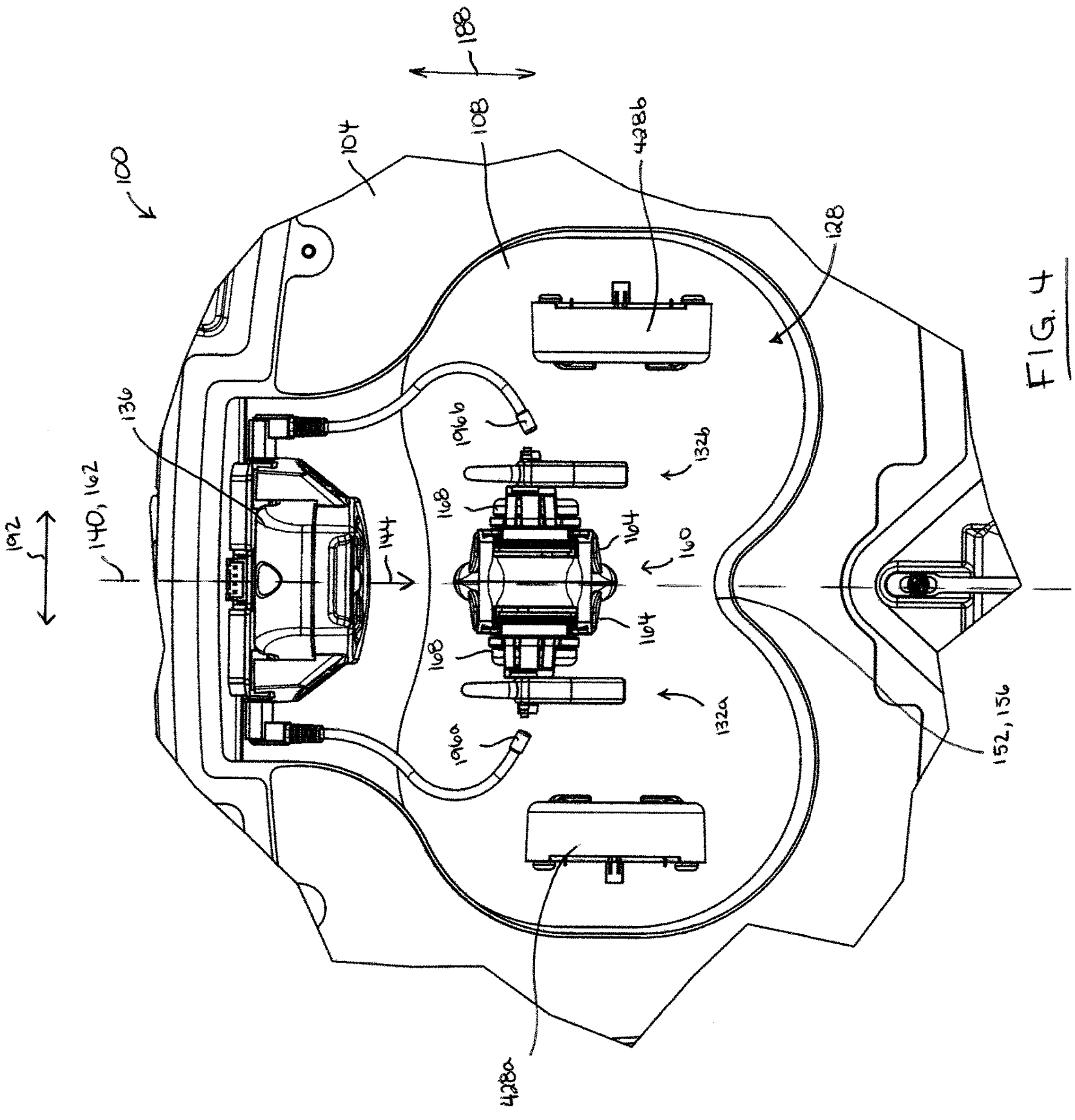
FIG. 4 is a cutaway top perspective view of the test apparatus of FIG. 3 with auxiliary speakers.

Reference is now made to FIGS. 3 and 4, which show a partial cutaway view of test apparatus 100 in a closed position. As shown, interior cavity walls 124 of lid cavity 116 and a portion of base 108 may cooperate to define a closed sound chamber 128 (the upper portion of the sound chamber 128 is cutaway to provide a view inside). As shown, a binaurally-coupled pair of acoustic devices 132*a* and 132*b* may be positioned inside the sound chamber 128 for testing.

Test apparatus 100 includes a primary speaker 136 for emitting reference sounds into the sound chamber 128. As used herein, and in the claims, a "speaker" in the singular means one or more sound emitting devices of any suitable type which cooperate to emit sound laterally symmetrically about a facing direction. For example, primary speaker 136 may comprise a single driver or a plurality of drivers in a common speaker housing. Primary speaker 136 may be positioned inside sound chamber 128, as shown. Alternatively, primary speaker 136 may be positioned outside sound chamber 128 and emit sound into sound chamber 128. For example, sound chamber 128 may include one or more openings or an area of low sound insulation (e.g. in lid 104 or base 108) through which primary speaker 136 may emit sound from outside of sound chamber 128.

Still referring to FIGS. 3 and 4, sound chamber 128 may be substantially symmetrical about a vertical mirror plane 140. As shown, the shape and size of sound chamber 128 (as defined by lid 104 and base 108) may be substantially identical on each side of the mirror plane 140. Further, primary speaker 136 may be positioned and oriented to face a speaker direction 144, which lies in the mirror plane 140. Assuming that primary speaker 136 emits sound laterally symmetrically about the speaker direction 144, this may permit primary speaker 136 to generate a substantially identical sound field on each side of the mirror plane 140 inside sound chamber 128. Accordingly, this may permit acoustic devices 132*a* and 132*b* to be positioned in the sound chamber 128 such that the sound stimulus to both acoustic devices 132*a* and 123*b* may be substantially identical.

Reference is now made to FIGS. 1 and 2. Lid 104 and base 108 may be made of any suitable materials. For example, at least a portion of lid 104 and base 108 may include sound insulating materials for mitigating environmental sounds entering the sound chamber 128 (FIG. 3), and to attenuate sound reflection inside the sound chamber 128. In the illustrated example, cavity walls 124 and upper base surface 148 comprise sound absorbing acoustic cotton.

Referring to FIGS. 3 and 4, sound insulating materials typically may have limited effectiveness in certain frequency ranges (e.g. low frequencies of less than 500 Hz), so that sound reflection is not completely eliminated. Sound reflected off of the chamber walls toward the microphones of acoustic devices 132 may complicate the sound fields at acoustic devices 132 undesirably. In some embodiments, sound chamber 128 may be shaped to help reduce sound reflection toward acoustic devices 132. As shown, sound chamber 128 may be formed with a nose 152 which projects rearwardly toward primary speaker 136. For example, nose 152, which is shown having lateral symmetry with respect to mirror plane 140, may be formed in a front cavity wall 156 of lid cavity 116 opposite primary speaker 136.

The shape of nose 152 may help to direct deflected sound waves laterally away from acoustic devices 132. This may help to reduce the contribution of deflected sound waves on the sound fields at acoustic devices 132. Each time a sound wave is deflected off the walls of sound chamber 128, the sound is attenuated. Therefore, even if the sound waves that laterally deflect off of nose 152 eventually reach acoustic devices 132 after several deflections, the sound waves will be significantly attenuated by those deflections mitigating their effect on the sound field at the acoustic devices 132.

Still referring to FIGS. 3 and 4, acoustic devices 132 may be positioned in the sound chamber 128 in any suitable fashion. For example, acoustic devices 132 may be removably mounted to a binaural test fixture 160 positioned inside sound chamber 128. As shown, binaural test fixture 160 may hold acoustic devices 132 in spaced apart relation and positioned symmetrically on opposite sides of the mirror plane 140. This may position each acoustic device 132 in a substantially identical sound field generated by primary speaker 136. The lateral distance between acoustic devices 132 may be equal to or less than that of a human head (e.g. less than 25 cm) to permit acoustic devices 132 to cross-communicate.

Figure 5:
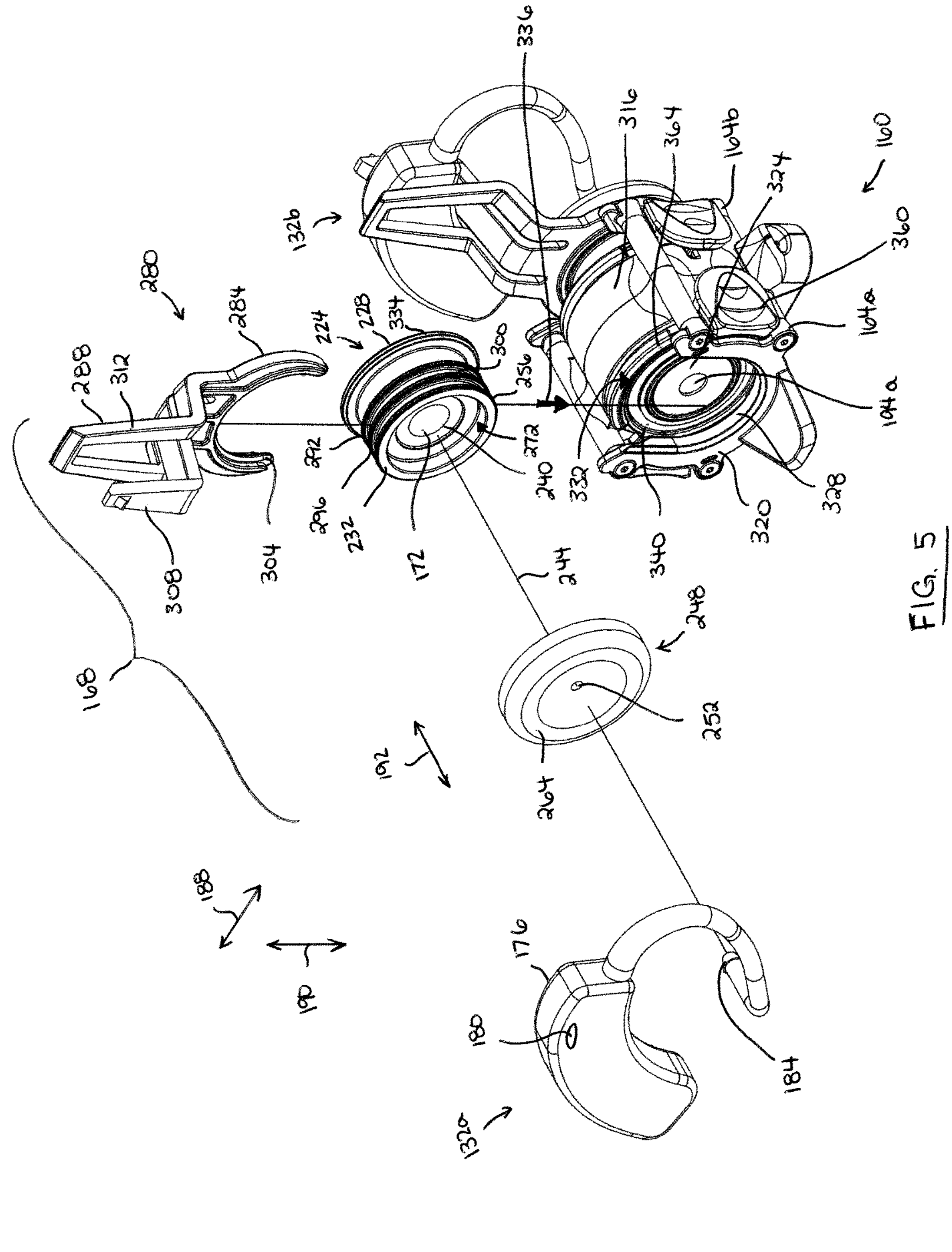
FIG. 5 is a perspective view of a binaural test fixture and an exploded acoustic coupler, in accordance with at least one embodiment.
Figure 6:
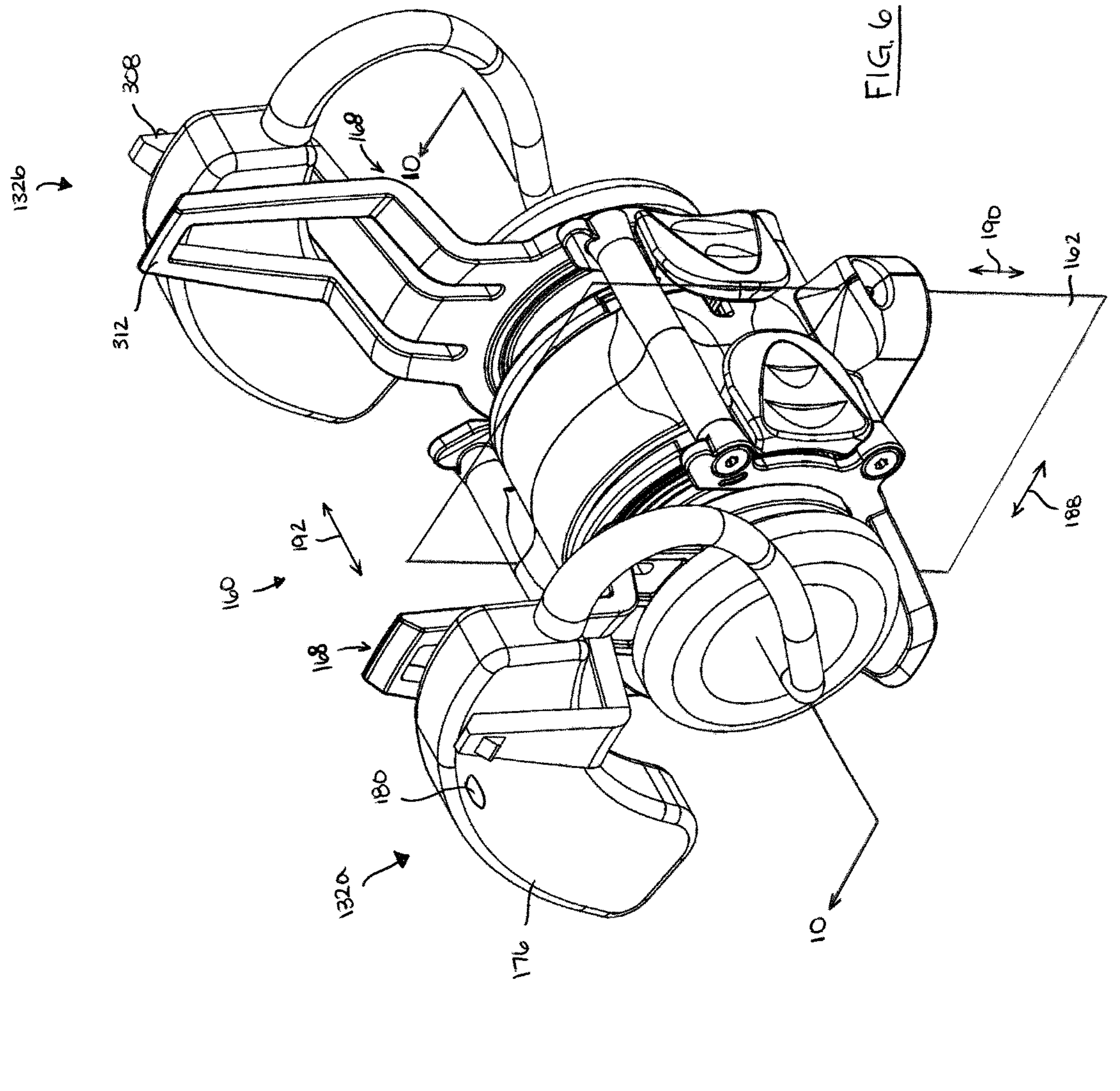
FIG. 6 is a perspective view of the binaural test fixture of FIG. 3.

Reference is now made to FIGS. 5 and 6 where a binaural test fixture 160 is shown in accordance with at least one embodiment. As shown, binaural test fixture 160 has a longitudinally and vertically extending lateral centerplane 162, and first and second acoustic coupler mounts 164*a* and 164*b* on opposite sides of the centerplane 162. In the figures, the longitudinal, vertical, and lateral directions are indicated by arrows 188, 190, and 192 respectively.

Each acoustic coupler mount 164 may be configured to hold an acoustic coupler assembly 168 which defines a sound test cavity 172. As shown, an acoustic device 132 may include a microphone assembly 176 comprising a device microphone 180 for receiving sound from the surrounding sound field, and a device speaker 184 positioned to emit sound into the sound test cavity 172 of an acoustic coupler assembly 168. The sound test cavity 172 may be dimensioned according to a test specification (e.g. an ANSI standard). The binaural test fixture 160 may include an output measurement microphone 194 positioned proximate the sound test cavity 172 of an acoustic coupler assembly 168 held by each acoustic coupler mount 164 for receiving the sound emitted into the sound test cavity 172.

Returning to FIG. 4, test apparatus 100 may include at least one input reference microphone 196. Input reference microphone 196 may be positionable proximate an acoustic coupler mount 164 for detecting the sound field of the connected acoustic device 132. For example, input reference microphone 196 may be positionable within close proximity (e.g. less than 5 mm) of the device microphone 180 of the associated acoustic device 132 for receiving reference sound from the test apparatus 100 which approximates the reference sound received by that device microphone 180.

With reference to FIGS. 4 and 5, in use each of two acoustic devices 132 may be mounted to a respective acoustic coupler assembly 168, and each acoustic coupler assembly 168 may be mounted to an acoustic coupler mount 164 of a binaural test fixture 160. The binaural test fixture 160 may be positioned in a sound chamber 128 with the centerplane 162 aligned coplanar with the mirror plane 140 of the sound chamber 128. A primary speaker 136 may emit reference sound which may be received simultaneously by the device microphones 180 of the acoustic devices 132 and at least one input reference microphone 196 positioned proximate one of the device microphones 180. Acoustic devices 132 may process the reference sound received by device microphones 180, and optionally communicate with each other, to generate an output sound emitted by device speakers 184 into respective sound test cavities 172 (FIG. 5). The sound produced in each sound test cavity 172 may be received by a respective output measurement microphone 194 (FIG. 5).

Figure 7:
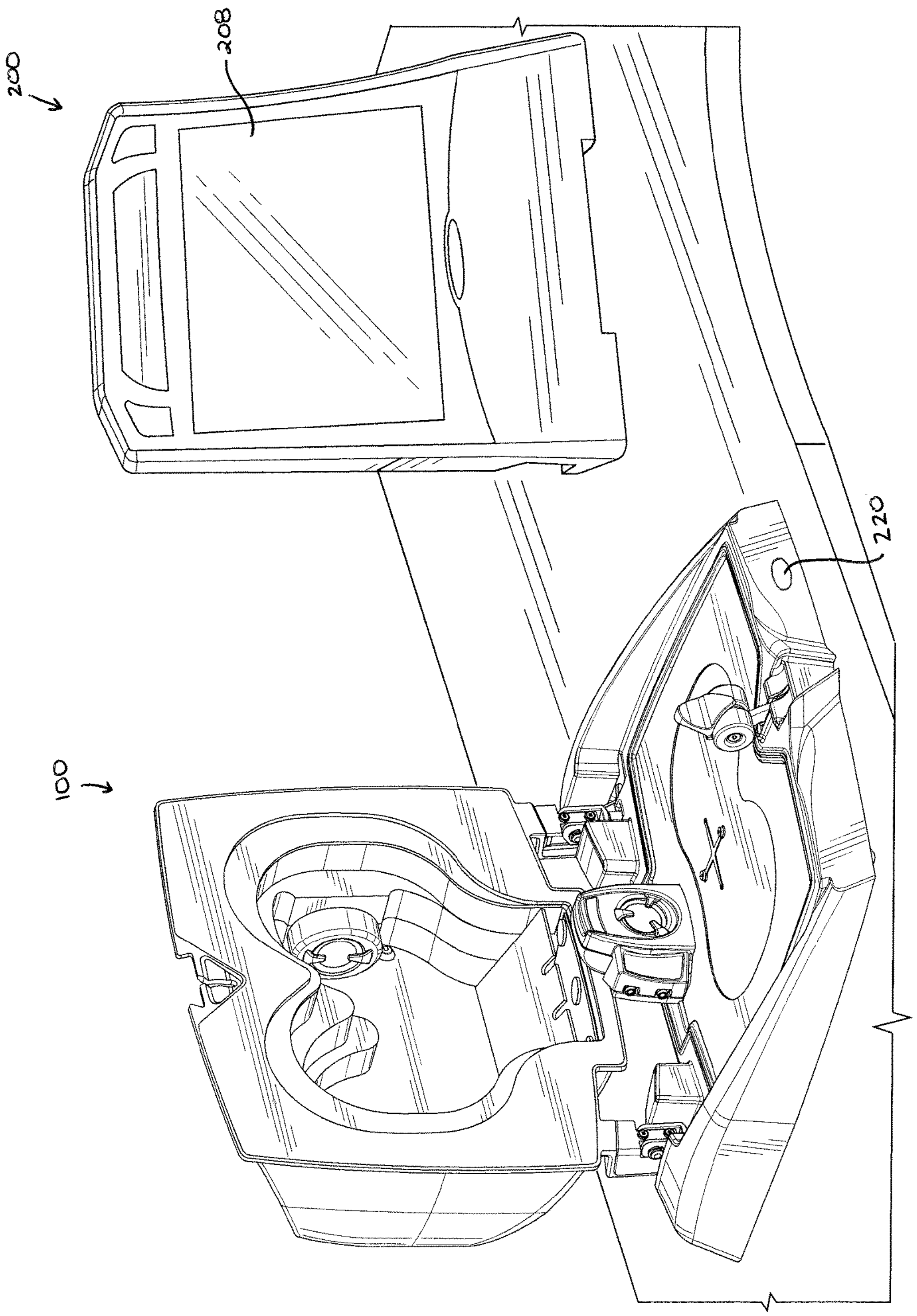
FIG. 7 is a perspective view of the test apparatus of FIG. 1 and a controller, in accordance with at least one embodiment.

Sound received at output measurement and input reference microphones 194 and 196 may be compared (e.g. against test parameters) to evaluate the performance of the binaurally-coupled acoustic devices 132*a* and 132*b*. Referring to FIG. 7, test apparatus 100 may include a controller 200 for receiving sound information from output measurement and input reference microphones 194 and 196, and for processing the sound information to evaluate the performance of the binaurally-coupled acoustic devices 132 (FIG. 3). Controller 200 may be a discrete device from lid 104 and base 108 as shown. Alternatively, one or more components (or the entirety) of controller 200 may be incorporated into lid 104 and/or base 108.

Figure 8:
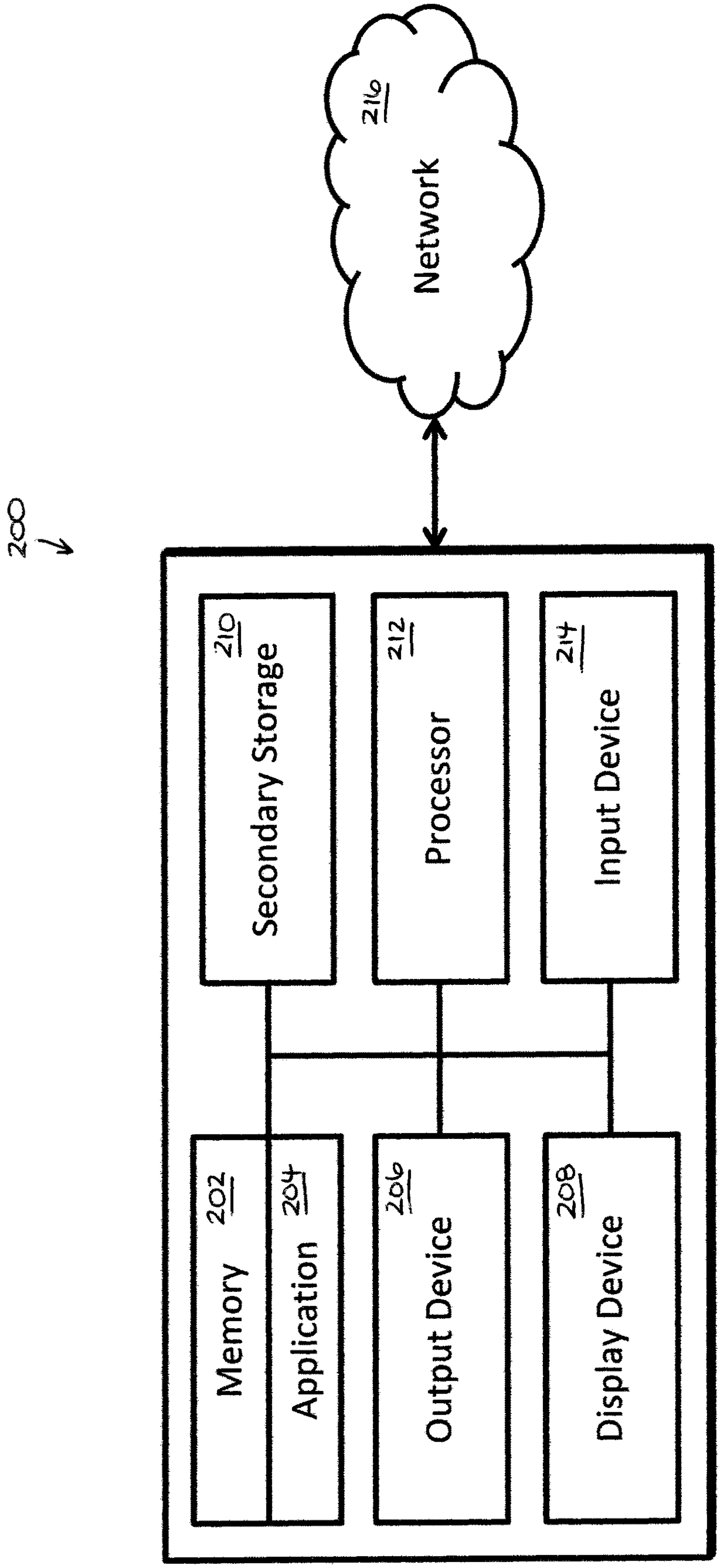
FIG. 8 is a schematic view of a controller, in accordance with at least one embodiment.

FIG. 8 shows an example schematic of controller 200. Generally, controller 200 can be a server computer, desktop computer, notebook computer, tablet, PDA, smartphone, integrated circuit or another computing device. In at least one embodiment, controller 200 includes a connection with a network 216 such as a wired or wireless connection to the Internet or to a private network. In some cases, network 216 includes other types of computer or telecommunication networks.

In the example shown, controller 200 includes a memory 202, an application 204, an output device 206, a display device 208, a secondary storage device 210, a processor 212, and an input device 214. In some embodiments, controller 200 includes multiple of any one or more of memory 202, application 204, output device 206, display device 208, secondary storage device 210, processor 212, and input device 214. In some embodiments, controller 200 does not include one or more of applications 204, second storage devices 210, network connections, input devices 214, output devices 206, and display devices 208.

Memory 202 can include random access memory (RAM) or similar types of memory. Memory 202 may be volatile or non-volatile data storage. Also, in some embodiments, memory 202 stores one or more applications 204 for execution by processor 212. Applications 204 correspond with software modules including computer executable instructions to perform processing for the functions and methods described herein. Secondary storage device 210 can include a hard disk drive, floppy disk drive, CD drive, DVD drive, Blu-ray drive, solid state drive, flash memory or other types of non-volatile data storage.

In some embodiments, controller 200 stores information in a remote storage device, such as cloud storage, accessible across a network, such as network 216 or another network. In some embodiments, controller 200 stores information distributed across multiple storage devices, such as memory 202 and secondary storage device 210 (i.e. each of the multiple storage devices stores a portion of the information and collectively the multiple storage devices store all of the information). Accordingly, storing data on a storage device as used herein and in the claims, means storing that data in a local storage device, storing that data in a remote storage device, or storing that data distributed across multiple storage devices, each of which can be local or remote.

Generally, processor 212 can execute applications, computer readable instructions or programs. The applications, computer readable instructions or programs can be stored in memory 202 or in secondary storage 210, or can be received from remote storage accessible through network 216, for example. When executed, the applications, computer readable instructions or programs can configure the processor 212 (or multiple processors 212, collectively) to perform the acts described herein.

Input device 214 can include any device for entering information into controller 200. For example, input device 214 can be a keyboard, key pad, cursor-control device, touch-screen, camera, or microphone (e.g. output measurement and input reference microphones 194 and 196). Input device 214 can also include input ports and wireless radios (e.g. Bluetooth®, or 802.11x) for making wired and wireless connections to external devices (e.g. output measurement and input reference microphones 194 and 196).

Display device 208 can include any type of device for presenting visual information. For example, display device 208 can be a computer monitor, a flat-screen display, a projector or a display panel.

Output device 206 can include any type of device for presenting a hard copy of information, such as a printer for example. Output device 206 can also include other types of output devices such as speakers (e.g. primary speaker 136), for example. In at least one embodiment, output device 206 includes one or more of output ports and wireless radios (e.g. Bluetooth®, or 802.11x) for making wired and wireless connections to external devices (e.g. primary speaker 136).

FIG. 8 illustrates one example hardware schematic of a controller 200. In alternative embodiments, controller 200 contains fewer, additional or different components. In addition, although aspects of an implementation of controller 200 may be described as being stored in memory, one skilled in the art will appreciate that these aspects can also be stored on or read from other types of computer program products or computer-readable media, such as secondary storage devices, including hard disks, floppy disks, CDs, or DVDs; a carrier wave from the Internet or other network; or other forms of RAM or ROM.

Referring to FIG. 4, controller 200 (FIG. 7) may control primary speaker 136 to generate reference sound fields at device microphones 180. Some performance test specifications require particular sound fields at device microphones 180. In this case, controller 200 may form a feedback loop with the input reference microphone 196 to modulate the reference sound emitted by primary speaker 136 until the sound field measured by input reference microphone 196 satisfies the test specification.

Where test apparatus 100 includes just one input reference microphone 196 positioned to measure the sound field at the device microphone 180 of one acoustic device 132, controller 200 may assume that the recorded sound field is identical to the sound field at the other device microphone 180. The symmetry of sound chamber 128, primary speaker 136, and acoustic devices 132 relative to the mirror plane 140 may make this assumption reasonably accurate. Controller 200 may compare the sound received at the one input reference microphone 196 against each of the output measurement microphones 194*a* and 194*b* for performance testing the acoustic devices 132*a* and 132*b*.

Still referring to FIG. 4, in some embodiments, test apparatus 100 includes two input reference microphones 196*a* and 196*b*, each input reference microphone 196 positionable proximate a respective acoustic coupler mount 164 in close proximity to the device microphone 180 of a connected acoustic device 132. Each input reference microphone 196 may communicate sound information to controller 200.

In some embodiments, controller 200 may compare the reference sound received at the first input reference microphone 196*a* to the reference sound received at the second input reference microphone 196*b*. For example, in some embodiments, for each of a plurality of sound frequencies (i.e. individual frequencies or frequency ranges), controller 200 (e.g. processor 212 executing computer readable instructions) may compare an amplitude of that frequency in the reference sound received at the first input reference microphone 196*a* to an amplitude of that frequency in the reference sound received at the second input reference microphone 196*b*.

In some cases, the comparison may include determining whether a difference between any of the compared amplitudes exceeds a first predetermined threshold (e.g. 2.5 decibels). This may indicate that the sound fields at the two input reference microphones 196*a* and 196*b* are too different to complete the performance test. This may occur as a result of improper positioning of acoustic devices 132 relative to binaural test fixture 160, improper positioning of binaural test fixture 160 relative to mirror plane 140, improper positioning of input reference microphones 196 relative to device microphones 180, or combinations thereof.

Referring to FIG. 7, if the comparison determines that a difference between the reference sound received at the first input reference microphone 196*a* compared to the reference sound received at the second input reference microphone 196*b* exceeds the first predetermined threshold, then controller 200 may suspend the performance test and display an error notification. Displaying the error notification may take any suitable form, such as controlling illumination of an error light 220 (e.g. causing error light 220 to turn on, off, or blink), or displaying an error message on display device 208 (e.g. LCD monitor or similar). The error notification notifies the user of the discrepancy in the sound fields at the input reference microphones 196.

In some cases, the comparison may include determining whether a difference between any of the compared amplitudes falls below a second predetermined threshold. The second predetermined threshold may be the same as or less than the first predetermined threshold. This may indicate sufficient symmetry in the sound fields as between the two input reference microphones 196 to complete the performance test. In this case, controller 200 may average the reference sound received at the first and second input reference microphones 196, and use this averaged sound information for comparison with the sound information from output measurement microphones 194. In one aspect, averaging the sound information from the input reference microphones 196 may help to compensate (i.e. error correct) for minor variances between the sound fields at the first and second input reference microphones 196*a* and 196*b*.

Alternatively, controller 200 may compare reference sound received by the first input reference microphone 196*a* to device sound received by the output measurement microphone 194*a*, and compare reference sound received by the second input reference microphone 196*b* to device sound received by the output measurement microphone 194*b*. In some embodiments, a comparison between the reference sound received at the first and second input reference microphones 196*a* and 196*b* may not be performed.

Figure 10:
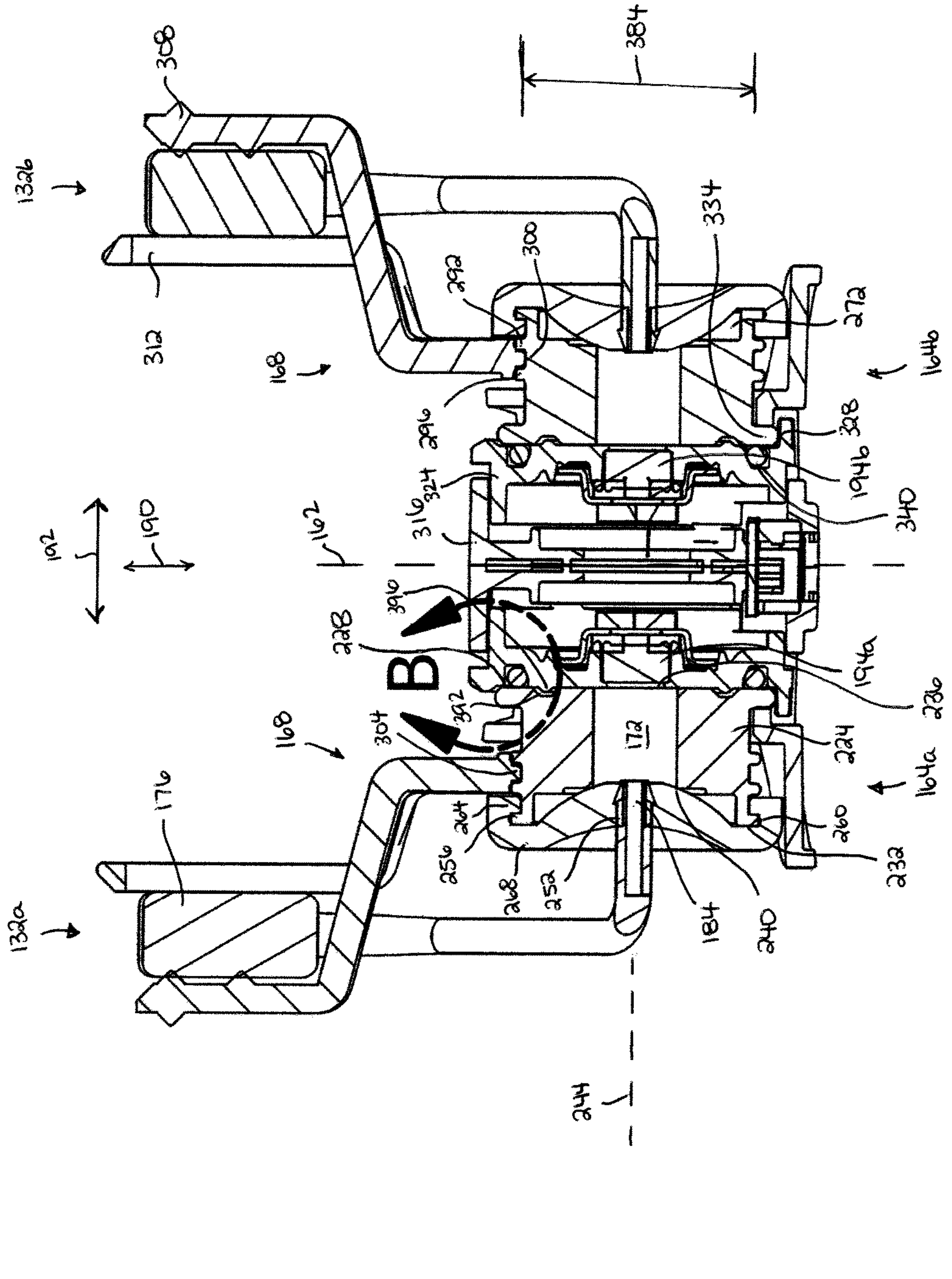
FIG. 10 is a cross-sectional view taken along line 10-10 in FIG. 6.

Referring to FIGS. 5 and 10, acoustic coupler assembly 168 may include a coupler body 224 which extends in length from a lateral inner body end 228 to a lateral outer body end 232. Coupler body 224 defines a sound test cavity 172 which extends between the lateral inner and outer body ends 228 and 232. In the illustrated example, sound test cavity 172 extends from a lateral inner test cavity opening 236 at lateral inner body end 228 to a lateral outer test cavity opening 240 spaced laterally inwardly from lateral outer body end 232. In alternative embodiments, lateral outer test cavity opening 240 may be positioned at lateral outer body end 232, and/or lateral inner test cavity opening 236 may be recessed laterally inwardly from lateral inner body end 228.

Still referring to FIGS. 5 and 10, coupler body 224 may have any suitable shape and size compatible with the performance test specification for which the coupler body 224 is intended. For example, coupler body 224 must be large enough to define a sound test cavity 172 having the volume and shape stipulated by the performance test specification (e.g. ANSI standard). In the illustrated example, coupler body 224 and sound test cavity 172 are substantially cylindrical in shape. In alternative embodiments, one or both of couple body 224 and sound test cavity 172 may have a different shape (e.g. a square, triangular, or oblong cross-section).

With continued reference to FIGS. 5 and 10, sound test cavity 172 may be positioned at any suitable radial position in coupler body 224. As shown, sound test cavity 172 has a laterally extending sound test cavity centerline 244. In the illustrated example, sound test cavity 172 and coupler body 224 share a common centerline 244 (e.g. they are concentric). This may provide cylindrical symmetry, which may permit coupler body 224 to be inserted into an acoustic coupler mount 164 without regard to the rotary orientation of coupler body 224 about centerline 244. In alternative embodiments, sound test cavity centerline 244 may be offset from the centerline of coupler body 224. This may provide distinguishable rotary orientations to coupler body 224 about centerline 244, which may define limited insertion directions into acoustic coupler mount 164.

Still referring to FIGS. 5 and 10, acoustic coupler assembly 168 may include an acoustic device speaker mount 248 for holding a device speaker 184 in alignment with the sound test cavity 172. As shown, acoustic device speaker mount 248 may be connected to the lateral outer body end 232 and include a speaker mount opening 252 sized to grasp a device speaker 184 received in the speaker mount opening 252. Speaker mount opening 252 may be aligned substantially concentrically with the sound test cavity centerline 244 for centering a device speaker 184 held in speaker mount opening 252 with the sound test cavity 172.

Acoustic device speaker mount 248 may be formed of any suitable material. In some embodiments, acoustic device speaker mount 248 may comprise a resiliently deformable material (e.g. rubber), which may permit speaker mount opening 252 to stretch for receiving device speakers 184 of different sizes. In some embodiments, acoustic device speaker mount 248 may comprise rigid material(s), such as hard plastic or metal, for example.

Still referring to FIGS. 5 and 10, acoustic device speaker mount 248 may be connected to coupler body 224 in any suitable fashion. For example, acoustic device speaker mount 248 may be removably connected to coupler body 224 as shown, or permanently connected to coupler body 224. Further, acoustic device speaker mount 248 may be a discrete component from coupler body 224 as shown, or integrally formed with coupler body 224.

In the illustrated embodiment, coupler body 224 includes an outer mounting flange 256 proximate lateral outer body end 232. As shown, acoustic device speaker mount 248 may include a mounting slot 260 sized to hold the acoustic device speaker mount 248 on coupler body 224 when outer mounting flange 256 is received in mounting slot 260.

As exemplified, outer mounting flange 256 may fully circumscribe coupler body 224. Alternatively, outer mounting flange 256 may extend around a continuous or discontinuous sub-portion of coupler body 224. As exemplified, mounting slot 260 may circumscribe outer mounting flange 256 when acoustic device speaker mount 248 is connected to coupler body 224. Alternatively, mounting slot 260 may extend around a continuous or discontinuous sub-portion of outer mounting flange 256 when acoustic device speaker mount 248 is connected to coupler body 224.

Acoustic device speaker mount 248 may include a lateral inner mount end 264 and a lateral outer mount end 268. The speaker mount opening 252 may be formed in the lateral outer mount end 268, and mounting slot 260 may be formed between the lateral inner and outer mount ends 264 and 268. For example, the lateral inner mount end 264 may form an inner wall of mounting slot 260 and the lateral outer mount end 268 may form an outer wall of mounting slot 260. As shown, lateral inner mount end 264 may be positioned laterally inwardly of outer mounting flange 256 when outer mounting flange 256 is received in mounting slot 260.

Still referring to FIGS. 5 and 10, in some embodiments acoustic coupler assembly 168 may be compatible with acoustic speaker mounting using acoustic device speaker mount 248 (e.g. for receiver-in-canal and behind-the-ear hearing aids), as well as by traditional putty-mounting techniques (e.g. for in-the-ear, in-the-canal, and completely in-the-canal style hearing aids). In the illustrated example, acoustic device speaker mount 248 is removably connected to coupler body 224 and lateral outer test cavity opening 240 is laterally recessed to define a putty-mount cavity 272 between lateral outer body end 232 and lateral outer test cavity opening 240, which is sized to receive a putty-mounted acoustic device.

Figure 11A:
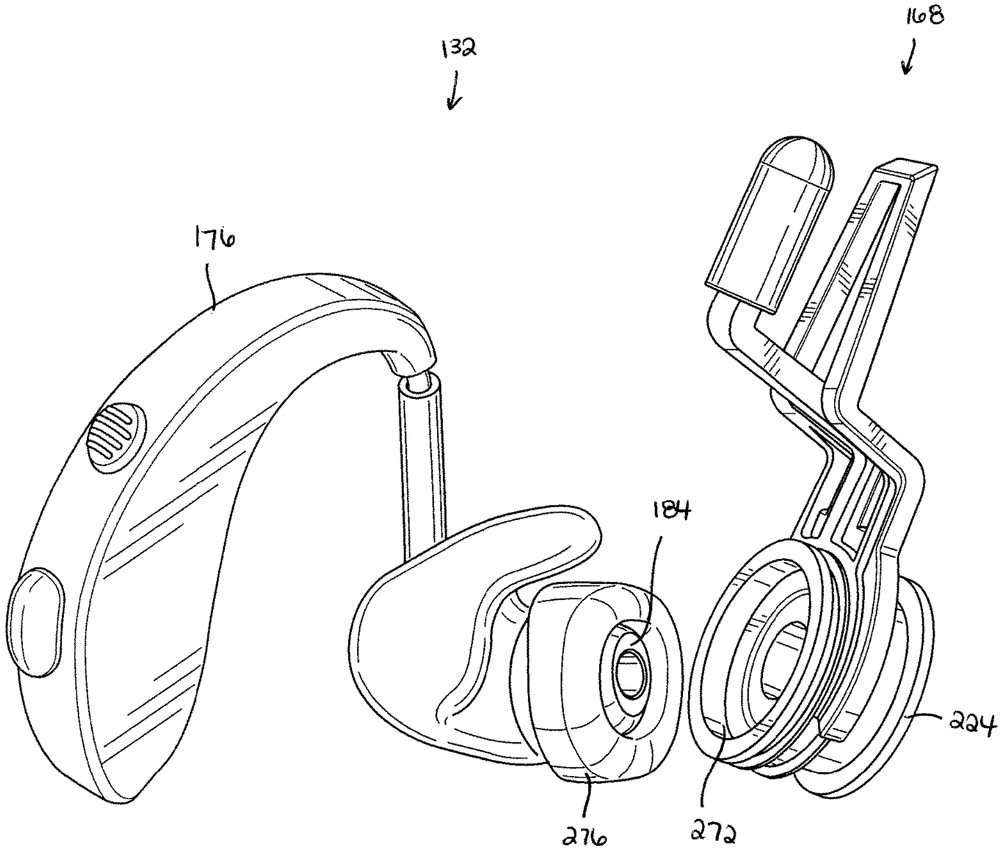
FIGS. 11A to 11C illustrate a method of putty mounting an acoustic device to an acoustic coupler.
Figure 11B:
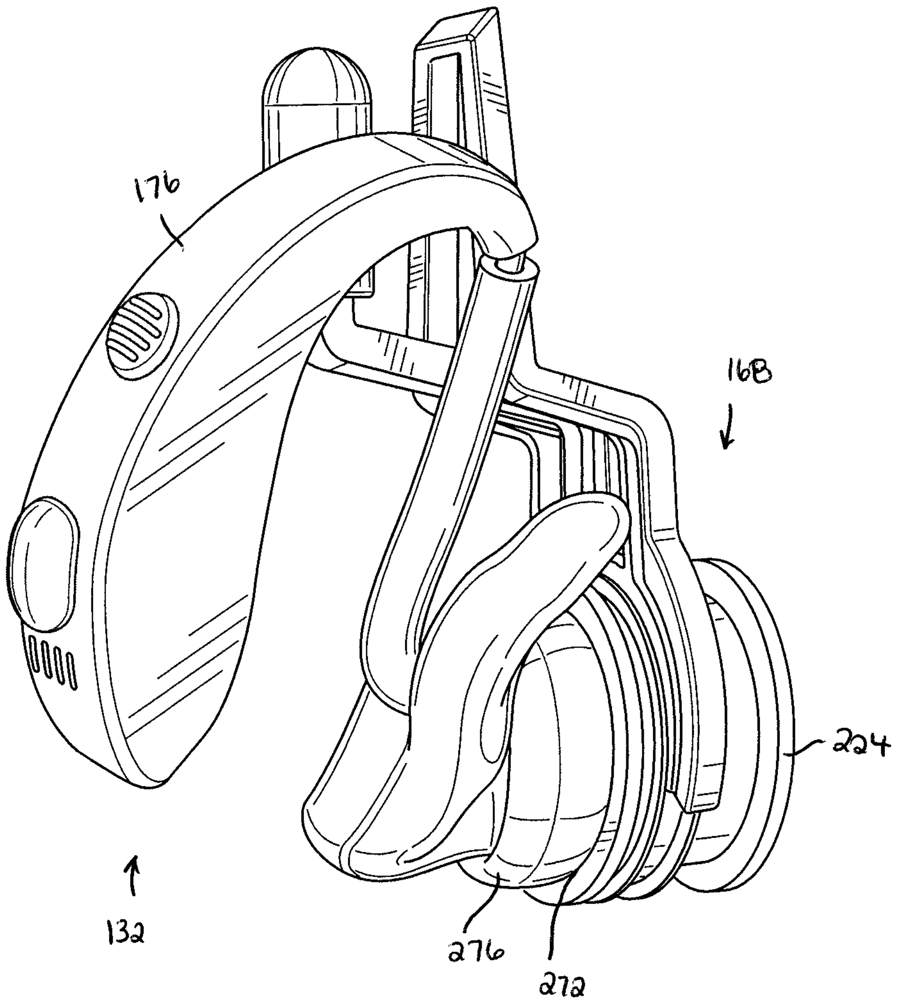

FIGS. 11A and 11B illustrate a method of putty-mounting an acoustic device 132 to coupler body 224. As shown in FIG. 11A, putty 276 may be applied to surround device speaker 184 of acoustic device 132. Next, the puttied device speaker 184 may be squeezed into putty-mount cavity 272 wherein device speaker 184 may be firmly positioned in close proximity to lateral outer test cavity opening 240 or even slightly inside sound test cavity 172, as shown in FIG. 11B. As exemplified, putty 276 may fill any gaps between putty-mount cavity 272 and device speaker 184, and help to align device speaker 184 with sound test cavity 172.

Putty-mounting may be a suitable alternative for some acoustic devices which are not compatible with acoustic device speaker mount 248. However, putty-mounting can be time consuming compared with using acoustic device speaker mount 248. Also, the quality of the acoustic seal of lateral outer test cavity opening 240 and alignment of device speaker 184 when using putty 276 depends on user technique, which can lead to inconsistent results. Further, putty 276 is difficult to clean, which can lead to unsanitary bacteria growth if reused, or else expense if putty 276 is discarded after each use.

Referring to FIGS. 5 and 10, as shown, acoustic device speaker mount 248 may be removably mounted to coupler body 224 to cover lateral outer body end 232. Acoustic device speaker mount 248 may cooperate with a device speaker 184 inserted therein to acoustically seal a sound test cavity 172. For example, acoustic device speaker mount 248 may contact lateral outer test cavity opening 240 when mounted to coupler body 224 so that speaker mount opening 252 is the only remaining unsealed portion of lateral outer test cavity opening 240. As shown, a device speaker 184 may be received in speaker mount opening 252 to complete the seal of lateral outer test cavity opening 240.

Still referring to FIGS. 5 and 10, if lateral outer test cavity opening 240 is laterally recessed (e.g. to provide a putty-mount cavity) 272, acoustic device speaker mount 248 may extend laterally inwardly to contact lateral outer test cavity opening 240. For example, a central portion of lateral outer mount end 268 may deflect laterally inwardly to mate with a peripheral edge of lateral outer test cavity opening 240. This may permit acoustic device speaker mount 248 to seal a recessed lateral outer test cavity opening 240.

With continuing reference to FIGS. 5 and 10, in some embodiments, acoustic coupler assembly 168 may include an acoustic device microphone mount 280 for supporting a device microphone assembly 176 of a connected acoustic device 132. Acoustic device microphone mount 280 may include a body connector end 284 for connecting acoustic device microphone mount 280 to coupler body 224, and a microphone connector end 288 for supporting device microphone assembly 176.

Body connector end 284 may be connected to coupler body 224 in any suitable fashion. For example, body connector end 284 may be integrally formed with coupler body 224, or separately formed and mounted to coupler body 224 as shown. Further, body connector end 284 may be permanently connected to coupler body 224, or removably mounted to coupler body 224 as shown. In the illustrated example, coupler body 224 includes inner and outer external mounting rings 292 and 296. As shown, inner and outer external mounting rings 292 and 296 may be positioned between lateral inner and outer body ends 228 and 232, and laterally spaced apart to form an exterior mounting channel 300 therebetween.

Body connector end 284 may be sized and shaped to mate with exterior mounting channel 300. In the illustrated example, body connector end 284 includes an arcuate protrusion 304 which is sized to fit into mounting channel 300 and which extends across greater than 180 degrees to grasp onto coupler body 224.

Figure 11C:
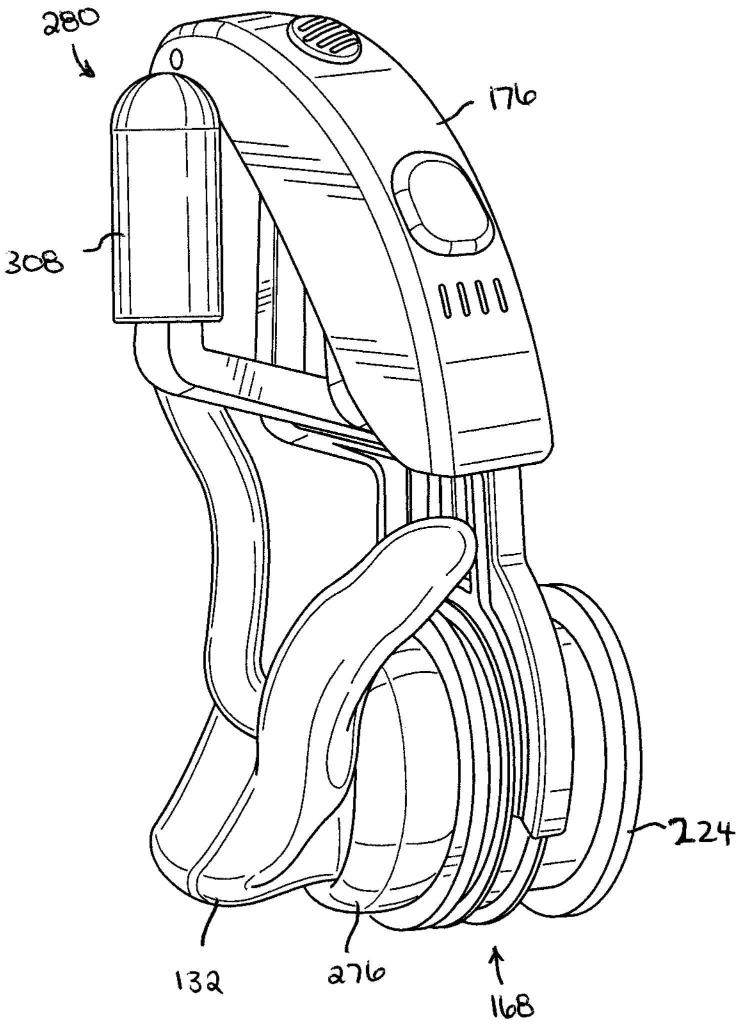

Still referring to FIGS. 5 and 10, microphone connector end 288 may include any suitable connector for grasping device microphone assembly 176. In the illustrated example, microphone connector end 288 comprises a microphone mount clip having laterally opposed fingers 308 and 312. Mount clip fingers 308 and 312 may be resiliently flexible for grasping a device microphone assembly 176 squeezed between them. In one aspect, the flexibility of fingers 308 and 312 may permit the microphone mount clip to accommodate device microphone assemblies of different sizes and shapes. FIG. 11C shows an example of an acoustic device microphone mount 280 holding a device microphone 180 of a putty-connected acoustic device 132.

Returning to FIGS. 5 and 10, in some embodiments, acoustic device microphone mount 280 may be movably connected to coupler body 224. This may permit the position of the connected microphone assembly 176 to enhance symmetry between the acoustic devices 132 and to better position device microphone 180 in the sound field. For example, microphone connector end 288 may be slidably connected to coupler body 224 for moving acoustic device microphone mount 280 about sound test cavity 172. In the illustrated example, arcuate protrusion 304 is slidable along mounting channel 300 for rotating acoustic device microphone mount 280 about sound test cavity centerline 244. In alternative embodiments, acoustic device microphone mount 280 may be rigidly connectable to coupler body 224.

Figure 9:
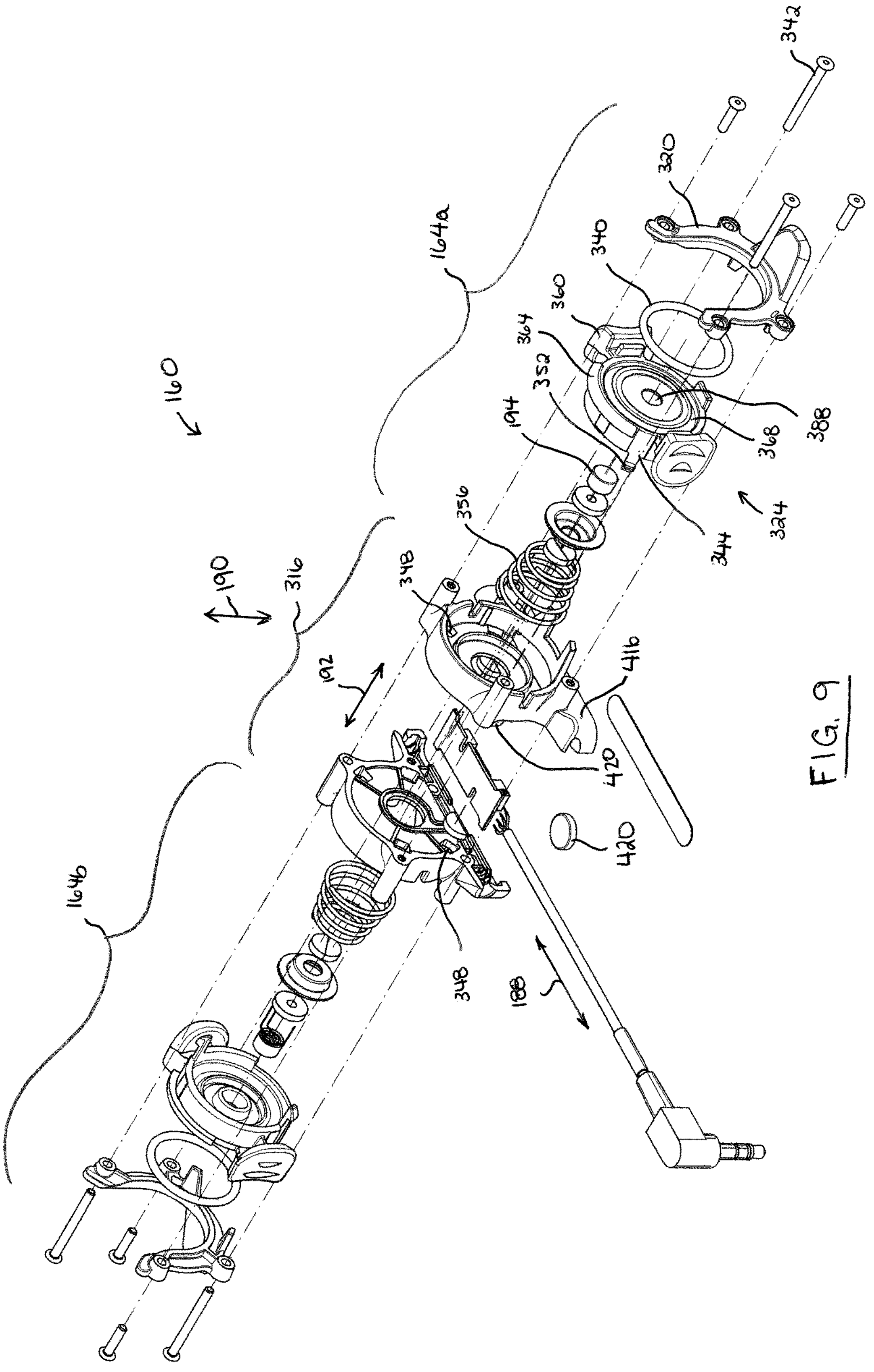
FIG. 9 is an exploded perspective view of the binaural test fixture of FIG. 3.

Reference is now made to FIGS. 9 and 10, which show a binaural test fixture 160 in accordance with at least one embodiment. As shown, binaural test fixture 160 may include a fixture body 316 having a centerplane 162, and first and second acoustic coupler mounts 164 positioned on opposite sides of centerplane 162. Acoustic coupler mounts 164 may take any suitable form for releasably holding an acoustic coupler assembly 168. In the illustrated example, acoustic coupler mount 164 includes a faceplate 320 connected to fixture body 316, and a seat 324 positioned between faceplate 320 and fixture body 316.

Faceplate 320 and seat 324 may define a receptacle therebetween sized to slidingly receive an acoustic coupler assembly 168. In the illustrated example, faceplate 320 and seat 324 are at least partially spaced apart to define a slot 328 for receiving an acoustic coupler assembly 168. As shown, slot 328 may have a slot inlet 332 positioned to receive an inner mounting flange 334 of an acoustic coupler assembly 168 inserted through slot inlet 332 in a slot insertion direction 336. Inner mounting flange 334 may be positioned proximate lateral inner body end 228, as shown.

Referring to FIG. 5, slot insertion direction 336 may be non-perpendicular to centerplate 162 (i.e. non-lateral). For example, slot insertion direction 336 may be substantially parallel to the centerplane 162 (e.g. vertical or longitudinal). More specifically, slot insertion direction 336 may be substantially transverse to sound test cavity centerline 244. This may reduce the development of high pressure in sound test cavity 172, which can damage output measurement microphone 194. Some known monaural test fixtures incorporate one-way air valves to mitigate the development of high pressure in the sound test cavity. The transverse slot insertion direction 336 of the illustrated embodiment may make such valves unnecessary, which may provide a reduction of cost and complexity.

Referring now to FIGS. 5, 9, and 10, seat 324 of acoustic coupler mount 164 may include a sealing member 340 facing away from centerplane 162 and sized to form a seal with a connected coupler body 224. In the illustrated example, sealing member 340 is an o-ring provided on a lateral outer face of seat 324. As shown in FIG. 10, sealing member 340 may form continuous contact with a lateral inner face of coupler body 224 to provide an acoustic seal.

It will be appreciated that repeated sliding insertions of coupler body 224 into an acoustic coupler mount 164 may tend to wear on a sealing member 340 if frictionally engaged by such sliding movements. In some embodiments, acoustic coupler mount 164 may permit relative lateral movement of faceplate 320 and seat 324. This may permit faceplate 320 and seat 324 to laterally separate during insertions and withdrawals of a coupler body 224. In turn, this may permit frictional disengagement between sealing member 340 and coupler body 224 during insertion and withdrawal.

Reference is now made to FIGS. 9 and 10. As shown, faceplate 320 may be rigidly connected to fixture body 316 in a suitable fashion (e.g. by screws 342), and seat 324 may be laterally movable relative to faceplate 320 and fixture body 316. Seat 324 may be movably connected to fixture body 316 in any suitable fashion. In the illustrated example, seat 324 includes laterally inwardly extending arms 344 (FIG. 9) which are slidably received in arm openings 348 of fixture body 316. As shown, arms 344 may have terminal catches 352 which retain arms 344 in arm openings 348 to limit lateral movement of seat 324.

Still referring to FIGS. 9 and 10, seat 324 may be biased laterally outwardly (i.e. away from centerplane 162) toward faceplate 320 for sealing against a coupler body 224 positioned between seat 324 and faceplate 320. Seat 324 may be laterally outwardly biased by any suitable biasing member 356. In the illustrated example, biasing member 356 is a coil spring positioned between fixture body 316 and seat 324 to urge seat 324 away from fixture body 316. In some embodiments, seat 324 may be manually (i.e. by hand) laterally inwardly movable against the bias of biasing member 356. For example, seat 324 may include grips 360 that may be manually grasped to manipulate the lateral position of seat 324. In use, a user may grasp grips 360 and move seat 324 laterally inwardly to provide clearance to freely insert or withdraw a coupler body 224 into or from acoustic coupler mount 164, which may reduce frictional wear on sealing member 340.

Figure 10B:
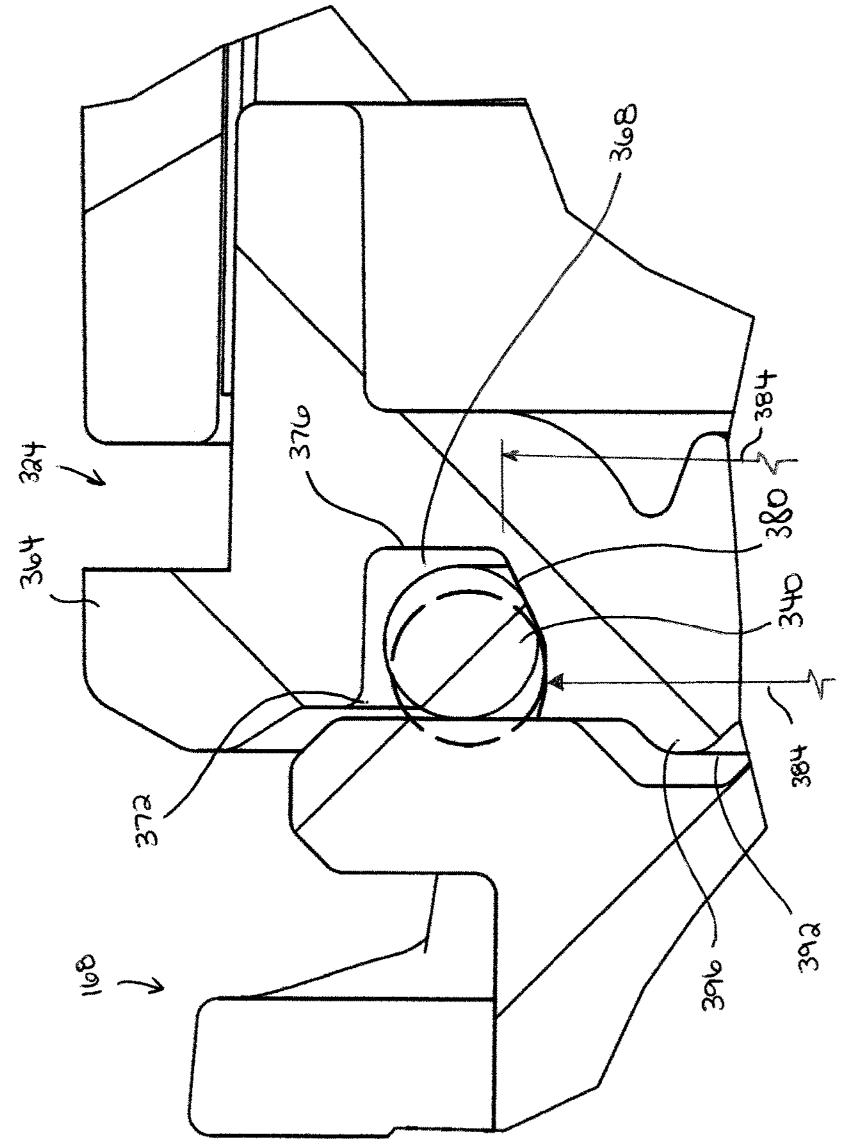
FIG. 10B is an enlargement of region B in FIG. 10.

In some embodiments, seat 324 may be configured to move laterally inwardly automatically (i.e. without separate user action) during insertion of a coupler body 224 into acoustic coupler mount 164. Referring to FIGS. 9 and 10B, seat 324 may include a spacer 364 which extends laterally outboard (i.e. away from centerplane 162) of sealing member 340. Spacer 364 may be positioned to ride a coupler body 224 during insertion and/or withdrawal whereby coupler body 224 is held laterally spaced apart from sealing member 340 during the insertion and/or withdrawal. As shown, spacer 364 may be positioned outside of slot 328, whereby a coupler body 224 will clear spacer 364 when insertion is complete. For example, spacer 364 may be positioned along a peripheral edge of slot 328. In the example shown, spacer 364 is positioned across slot inlet 332 for interfacing with a coupler body 224 during insertion and withdrawal.

In some cases, sealing member 340 may perform better when operating within a narrow range of sealing pressures. In some embodiments, sealing member 340 may be laterally movably mounted to seat 324 to help regulate the sealing pressure exerted between sealing member 340 and a coupler body 224. Reference is now made to FIGS. 10 and 10B. In the illustrated example, sealing member 340 is an o-ring mounted in a ring-shaped channel 368. As shown, channel 368 extends in depth from a laterally outer channel opening 372 to a laterally inner channel base 376. A radially inner channel wall 380 is shown extending between the laterally outer channel opening and the laterally inner channel base 376, and defining an inside channel diameter 384 of channel 368.

Referring to FIG. 10B, inside channel diameter 384 may increase between laterally outer channel opening 372 and the laterally inner channel base 376 in the direction of laterally inner channel base 376. For example, radial inner channel wall 380 may slope radially outwardly as it extends laterally inwardly. O-ring 340 may have an unstretched diameter of less than the maximum inside channel diameter 384. Accordingly, the tendency for o-ring 340 to retract toward its unstretched diameter may bias o-ring 340 laterally outwardly away from the position of maximum inside channel diameter 384. In use, laterally inward pressure on o-ring 340 by an inserted coupler body 224 may urge o-ring 340 to stretch in diameter and ride radial inner channel wall 380 laterally inwardly deeper into channel 368. This may help to regulate the sealing pressure exerted on o-ring 340 for improved sealing performance.

Referring to FIGS. 9 and 10, binaural test fixture 160 may include output measurement microphones 194*a* and 194*b* coupled to fixture body 316 on opposite sides of centerplane 162. For example, each output measurement microphone 194 may be rigidly mounted to a seat 324 for lateral movement with seat 324. This may permit output measurement microphones 194 to be positioned abutting a lateral inner test cavity opening 236 of an inserted acoustic coupler 168 for receiving output sounds emitted by a device speaker 184 into the sound test cavity 172. In the illustrated example, each output measurement microphone 194 is rigidly connected in a respective microphone opening 388 of a seat 324 and faces laterally outwardly away from centerplane 162.

Referring to FIG. 10, coupler body 224 and seat 324 may have mating alignment members to help align acoustic coupler 168 with seat 324. In turn, this may help to ensure alignment between sound test cavity 172 and output measurement microphone 194. In some embodiments, lateral inner body end 228 and lateral outer side of seat 324 may include one or more mating pairs of protrusions and recesses. In the illustrated example, lateral inner body end 228 includes a circular alignment groove 392 concentric with sound test cavity centerline 244, and lateral outer side of seat 324 includes a circular alignment ridge 396 concentric with output measurement microphone 194 and sized to mate with circular alignment groove 392.

Figure 12:
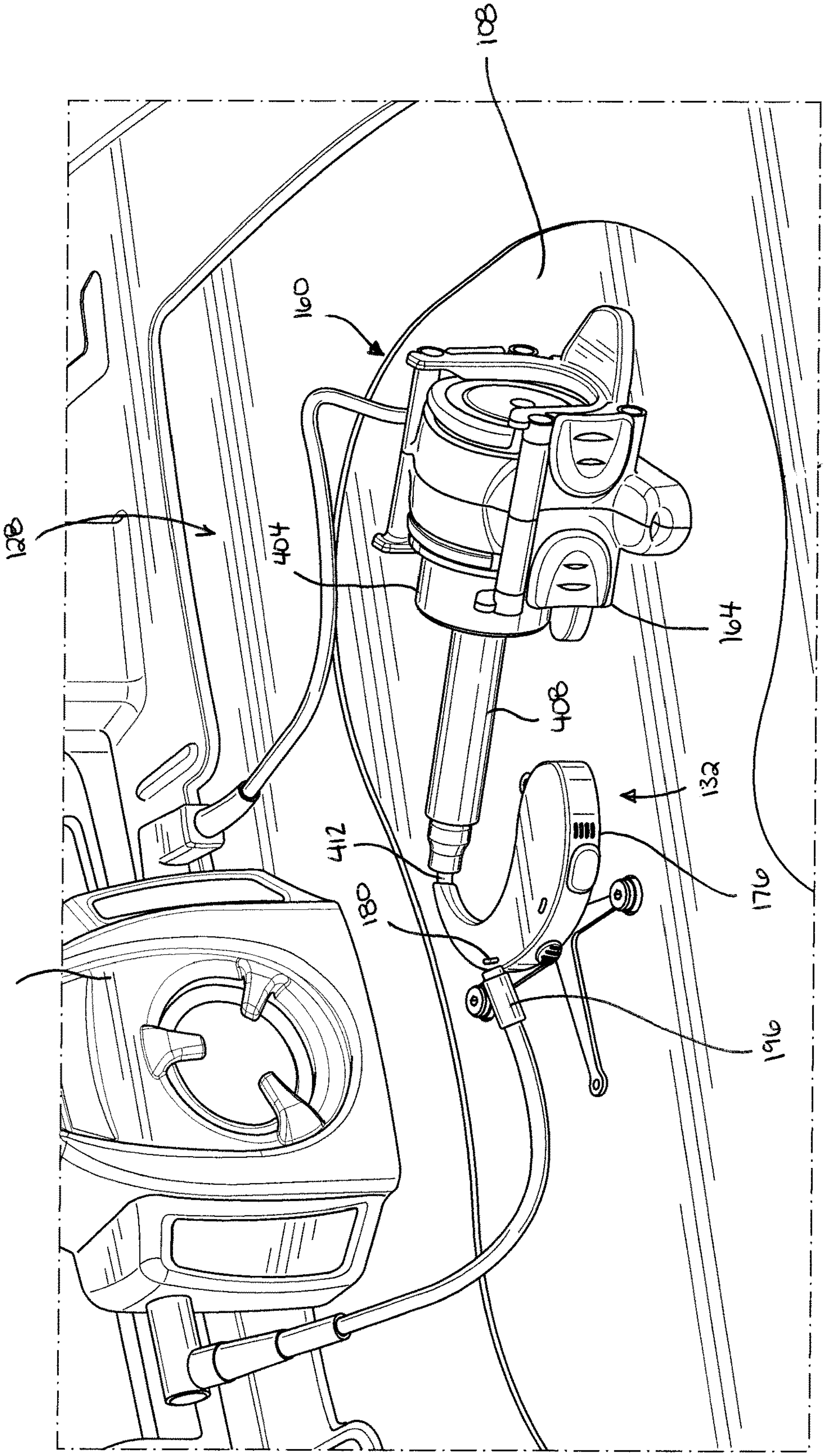
FIG. 12 is a partial perspective view of an acoustic device positioned in a sound chamber for monaural testing.

Turning now to FIG. 12, binaural test fixture 160 may be removably connected to base 108 as shown, or permanently connected to base 108. This may permit binaural test fixture 160 to be moved off-center to a lateral side of mirror plane 140 for performing monaural device testing, as shown. As exemplified, an acoustic device 132 mounted to an acoustic coupler assembly 404 may be connected to one of acoustic coupler mounts 164, and positioned with device microphone 180 aligned substantially centrally in the sound chamber.

Figure 13:
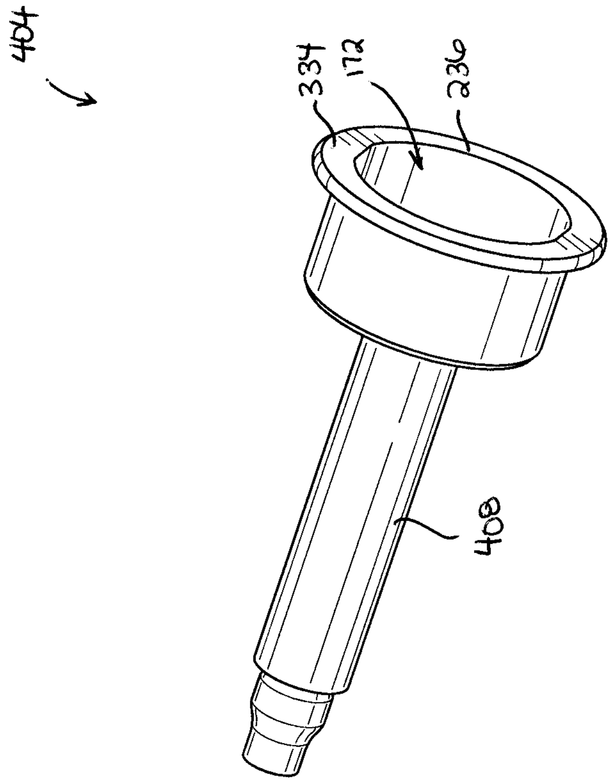
FIG. 13 is a perspective view of an acoustic coupler, in accordance with another embodiment.

FIGS. 12 and 13 also show an acoustic coupler assembly 404 in accordance with another embodiment, where like part numbers refer to like parts in the previous figures. As shown, acoustic coupler assembly 404 may include a tubular extension 408 extending laterally outwardly from sound test cavity 172 and sized to support conduit 412 between device microphone assembly 176 and device speaker 184.

Referring to FIGS. 1 and 9, in some embodiments, one or both of binaural test fixture 160 and base 108 may include mounting members which help to ensure symmetric alignment of binaural test fixture 160 on base 108 (e.g. where centerplane 162 is coplanar with mirror plane 140). For example, a lower body end 416 of fixture body 316 and upper base surface 148 may include two or more pairs of magnetically attractable members which may provide a removable connection and symmetrical alignment for binaural test fixture 160. In the illustrated example, lower body end 416 of fixture body 316 includes two magnets 420 which mate with two ferromagnetic members 424 on upper base surface 148.

Referring to FIGS. 2 and 4, test apparatus 100 may further include first and second auxiliary speakers 428*a* and 428*b* for directional performance testing. Auxiliary speakers 428 may be connected to one of lid 104 and base 108, and may be positioned on opposite sides of mirror plane 140 inside sound chamber 128. Auxiliary speakers 428 may be symmetrically positioned and oriented on opposite sides of mirror plane 140 to maintain symmetry of sound chamber 128. In the illustrated embodiment, auxiliary speaker 428 is connected to a cavity sidewall 124 inside lid cavity 116.

Auxiliary speakers 428 may be oriented to face non-parallel to mirror plane 140 to facilitate directional performance testing. In the illustrated example, auxiliary speakers 428 face laterally inwardly towards mirror plane 140 in a direction normal to mirror plane 140. In alternative embodiments, test apparatus 100 may not include auxiliary speakers 428.

While the above description provides examples of the embodiments, it will be appreciated that some features and/or functions of the described embodiments are susceptible to modification without departing from the spirit and principles of operation of the described embodiments. Accordingly, what has been described above has been intended to be illustrative of the invention and non-limiting and it will be understood by persons skilled in the art that other variants and modifications may be made without departing from the scope of the invention as defined in the claims appended hereto. The scope of the claims should not be limited by the preferred embodiments and examples, but should be given the broadest interpretation consistent with the description as a whole.

Items

Item 1: A test apparatus for binaurally-coupled acoustic devices, the apparatus comprising:

a base;

a lid coupled to the base, the lid movable between a closed position in which the lid and base cooperate to form a closed sound chamber that is symmetric about a vertical mirror plane, and an open position;

a primary speaker coupled to one of the base and the lid, the primary speaker facing a direction that lies on the mirror plane; and a binaural test fixture positioned inside the sound chamber, the binaural test fixture including first and second acoustic coupler mounts, the vertical mirror plane extending symmetrically between the first and second acoustic coupler mounts.

Item 2: The test apparatus of item 1, wherein:

the lid defines a lid cavity having an open lower end;

the sound chamber comprises the lid cavity; and the base closes the lower end of the lid cavity when the lid is in the closed position.

Item 3: The test apparatus of item 1 or item 2, wherein:

a front wall of the lid cavity defines a rearwardly projecting nose bisected by the mirror plane; and the primary speaker faces the nose when the lid is in the closed position.

Item 4: The test apparatus of, any one of items 1-3 wherein:

the primary speaker is positioned inside the sound chamber.

Item 5: The test apparatus of any one of items 1-4, wherein:

an outer body of the primary speaker is symmetric about the mirror plane.

Item 6: The test apparatus of any one of items 1-5, further comprising:

first and second input reference microphones.

Item 7: The test apparatus of item 6, wherein:

the first input reference microphone is positionable proximate the first acoustic coupler mount inside the sound chamber on a first side of the mirror plane, and the second input reference microphone is positionable proximate the second acoustic coupler mount inside the chamber on a second side of the mirror plane.

Item 8: The test apparatus of item 6 or item 7, further comprising:

one or more processors, collectively communicatively coupled to the first and second input reference microphones, the one or more processors, collectively, comparing output signals from the first input reference microphone to output signals from the second input reference microphone.

Item 9: The test apparatus of item 8, further comprising:

a display device, the one or more processors, collectively, controlling the display device to communicate an error notification in response to determining that a comparison of the output signals of the first and second input reference microphones indicates that a difference in a sound field at the first input reference microphone compared to a sound field at the second input reference microphone exceeds a predetermined threshold.

Item 10: The test apparatus of any one of items 1-9, wherein:

an outer body of the binaural test fixture is symmetric about the mirror plane.

Item 11: The test apparatus of any one of items 1-10, wherein:

the binaural test fixture further comprises first and second output measurement microphones.

Item 12: The test apparatus of item 11, wherein:

the first output measurement microphone is positioned proximate the first acoustic coupler mount on a first side of the mirror plane; and the second output measurement microphone is positioned proximate the second acoustic coupler mount on a second side of the mirror plane.

Item 13: The test apparatus of any one of items 1-12, further comprising:

first and second acoustic coupler assemblies, each acoustic coupler assembly defining a sound test cavity,

- the first acoustic coupler assembly removably connected to the first acoustic coupler mount, and
- the second acoustic coupler assembly removably connected to the second acoustic coupler mount.

Item 14: The test apparatus of item 13, wherein:

each sound test cavity includes open outer and inner ends,

- the open outer end sized to receive sound from an acoustic device speaker, and
- the open inner end sized to deliver sound to an output measurement microphone.

Item 15: The test apparatus of any one of items 1-14, further comprising:

first and second auxiliary speakers coupled to one of the base and the lid, the first and second auxiliary speakers positioned symmetrically on opposite sides of the mirror plane.

Item 16: The test apparatus of item 15, wherein:

each auxiliary speaker faces a direction that is non-parallel to the mirror plane.

Item 17: The test apparatus of any one of items 1-16, wherein:

the binaural test fixture is removably mounted to the base.

Item 18: The test apparatus of item 17, further comprising:

at least one alignment member which defines a position and orientation of the binaural test fixture relative to the base when the binaural test fixture is mounted to the base.

Item 19: The test apparatus of item 17 or item 18, wherein:

the binaural test fixture is removably mounted to the base by at least one magnet.

Item 20: The test apparatus of any one of items 1-19, wherein the sound chamber is at least partially lined by sound absorbing material of the lid and the base.

Item 21: A binaural test fixture for carrying two binaurally-coupled acoustic devices in a test apparatus, the binaural test fixture comprising:

a fixture body having a longitudinally and vertically extending lateral centerplane;

a first acoustic coupler mount and a first output measurement microphone connected to the fixture body on a first side of the centerplane; and a second acoustic coupler mount and a second output measurement microphone connected to the fixture body on a second side of the centerplane, each of the first and second output measurement microphones facing away from the centerplane.

Item 22: The binaural test fixture of item 21, wherein:

each acoustic coupler mount comprises a faceplate connected to the fixture body and a seat positioned between the faceplate and the fixture body, the faceplate and the seat defining a receptacle therebetween sized to slidingly receive an acoustic coupler assembly.

Item 23: The binaural test fixture of item 22, wherein:

the receptacle defined by each acoustic coupler mount is a slot having a slot inlet positioned to receive an acoustic coupler assembly slidingly inserted through the slot inlet in an insertion direction that is non-perpendicular to the lateral centerplane.

Item 24: The binaural test fixture of item 23, wherein the insertion direction is substantially parallel to the lateral centerplane.

Item 25: The binaural test fixture of any one of items 22-24, wherein the seat of each acoustic coupler mount comprises a sealing member facing away from the lateral centerplane and sized to seal against an acoustic coupler assembly when the acoustic coupler assembly is received in the receptacle.

Item 26: The binaural test fixture of item 25, wherein the sealing member is an o-ring.

Item 27: The binaural test fixture of item 26, wherein the seat of each acoustic coupler mount comprises a laterally outer side having a ring-shaped channel sized to receive the o-ring.

Item 28: The binaural test fixture of item 27, wherein:

the ring-shaped channel extends in depth from a laterally outer channel opening to a laterally inner channel base; and an inside diameter of the channel increases between the laterally outer channel opening and the laterally inner channel base towards the laterally inner channel base.

Item 29: The binaural test fixture of item 28, wherein:

the channel has a maximum inside diameter, and the o-ring has an unstretched diameter less than or equal to the maximum inside diameter of the channel.

Item 30: The binaural test fixture of item 25, wherein the seat of each acoustic coupler mount is movably coupled to the fixture body and biased away from the lateral centerplane toward the faceplate.

Item 31: The binaural test fixture of item 30, further comprising a bias positioned between the fixture body and the seat of each acoustic coupler mount, the bias acting to urge the respective seat laterally outwardly away from the fixture body.

Item 32: The binaural test fixture of item 31, wherein the bias is a coil spring.

Item 33: The binaural test fixture of any one of items 30-32, wherein:

the face plate of each acoustic coupler mount is rigidly connected to the base.

Item 34: The binaural test fixture of item 28, wherein:

the o-ring is resiliently stretchable, and a diameter of the o-ring stretches according to the inside diameter of the channel as an acoustic coupler assembly is received in the receptacle which pushes the o-ring laterally inwardly deeper into the channel.

Item 35: The binaural test fixture of any one of items 30-34, wherein:

the seat comprises a spacer extending laterally outboard of the sealing member, the spacer positioned to ride an acoustic coupler assembly during insertion of the acoustic coupler assembly into the receptacle whereby the sealing member is held laterally spaced apart from the acoustic coupler assembly during the insertion.

Item 36: The binaural test fixture of item 35, wherein:

the spacer is positioned outside of the receptacle.

Item 37: The binaural test fixture of item 36, wherein the spacer is positioned along a peripheral edge of the receptacle.

Item 38: The binaural test fixture of item 30, wherein:

the first output measurement microphone is rigidly connected to the seat of the first acoustic coupler mount; and the second output measurement microphone is rigidly connected to the seat of the second acoustic coupler mount.

Item 39: The binaural test fixture of item 38, wherein:

the first output measurement microphone is rigidly connected inside a first microphone opening in the seat of the first acoustic coupler mount, and the second output measurement microphone is rigidly connected inside a second microphone opening in the seat of the second acoustic coupler mount.

Item 40: The binaural test fixture of any one of items 22-39, wherein:

the fixture body comprises at least one mounting member positioned to connect with a base of a test apparatus.

Item 41: An acoustic coupler assembly for carrying an acoustic device, the acoustic coupler assembly comprising:

a coupler body extending in length from a lateral outer body end to a lateral inner body end, the body having a sound test cavity extending laterally between the lateral inner and outer body ends and the sound test cavity having lateral inner and outer test cavity openings and a laterally extending sound test cavity centerline; and an acoustic device speaker mount covering the lateral outer body end and having a speaker mount opening sized to grasp a speaker of an acoustic device received in the speaker mount opening, the speaker mount opening abutting the lateral outer test cavity opening.

Item 42: The acoustic coupler assembly of item 41, wherein the speaker mount opening is aligned concentrically with the sound test cavity centerline.

Item 43: The acoustic coupler assembly of any one of items 41-42, wherein the acoustic device speaker mount is formed of a resiliently deformable material.

Item 44: The acoustic coupler assembly of any one of items 41-43, wherein:

when a speaker of an acoustic device is received in the speaker mount opening, the acoustic device speaker mount and the speaker cooperate to seal closed the lateral outer test cavity opening.

Item 45: The acoustic coupler assembly of any one of items 41-44, wherein:

the coupler body and the sound test cavity are both cylindrical and concentric with the sound test cavity centerline.

Item 46: The acoustic coupler assembly of any one of items 41-45, wherein:

the acoustic device speaker mount contacts a peripheral edge of the lateral outer test cavity opening.

Item 47: The acoustic coupler assembly of item 46, wherein: the lateral outer test cavity opening is positioned laterally outwardly of the lateral outer body end.

Item 48: The acoustic coupler assembly of any one of item 41-47, wherein:

the acoustic device speaker mount is removably connected to the coupler body.

Item 49: The acoustic coupler assembly of item 47, wherein: the acoustic device speaker mount is removably connected to the coupler body; and the coupler body defines a putty-mount cavity between the lateral outer body end and the lateral outer test cavity opening sized to receive a putty mounted acoustic device.

Item 50: The acoustic coupler assembly of item 48, wherein: the coupler body includes an outer mounting flange proximate the lateral outer body end; and the acoustic device speaker mount includes a mounting slot sized to hold the acoustic device speaker mount on the coupler body when the outer mounting flange is received in the mounting slot.

Item 51: The acoustic coupler assembly of item 50, wherein: the outer mounting flange circumscribes the coupler body; and the mounting slot circumscribes the outer mounting flange when the acoustic device speaker mount is connected to the coupler body.

Item 52: The acoustic coupler assembly of item 51, wherein: the acoustic device speaker mount comprises a lateral outer mount end and a lateral inner mount end;

the speaker mount opening is formed in the lateral outer mount end; and the mounting slot is formed between the lateral inner and outer mount ends.

Item 53: The acoustic coupler assembly of item 52, wherein: the lateral inner mount end forms an inner wall of the mounting slot and is positioned laterally inwardly of the outer mounting flange when the acoustic device speaker mount is connected to the coupler body.

Item 54: The acoustic coupler assembly of any one of items 41-53, further comprising:

an acoustic device microphone mount connected to the coupler body, the acoustic device microphone mount including a microphone mount clip sized to grasp a microphone assembly of an acoustic device when the microphone assembly is received in the microphone mount clip.

Item 55: The acoustic coupler assembly of item 54, wherein: the acoustic device microphone mount is connected in contact with the coupler body between the lateral inner and outer body ends.

Item 56: The acoustic coupler assembly of item 55, wherein: the coupler body includes an exterior mounting channel between the lateral inner and outer body ends; and the acoustic device microphone mount includes a body connector end sized and shaped to mate with the exterior mounting channel.

Item 57: The acoustic coupler assembly of any one of items 54-56, wherein:

the acoustic device microphone mount is rotatable about the sound test cavity centerline.

Item 58: The acoustic coupler assembly of item 56, wherein: the body connector is slideably movable inside the exterior mounting channel.

Item 59: The acoustic coupler assembly of item 56, wherein: the coupler body comprises front and rear external mounting rings which are spaced apart to define the mounting channel therebetween.

Item 60: The acoustic coupler assembly of any one of items 41-59, wherein:

the coupler body comprises an inner mounting flange proximate the lateral inner body end and sized for receipt by an acoustic coupler mount of a test fixture.

Item 61: The acoustic coupler assembly of any one of items 41-60, wherein:

the coupler body comprises a lateral inner body wall at the lateral inner body end, and the lateral inner body wall comprises a circular alignment groove concentric with the sound test cavity centerline.

Item 62: A method of testing binaurally-coupled acoustic devices, the method comprising:

emitting reference sound from a primary speaker facing a reference direction, the reference direction lying in a mirror plane;

simultaneously receiving the reference sound at a first device microphone of a first acoustic device and at a second device microphone of a second acoustic device, the first and second device microphones being spaced apart on opposite sides of the mirror plane;

receiving the reference sound at a first input reference microphone positioned proximate the first device microphone;

receiving first output sound at a first output measurement microphone, the first output sound emitted by the first acoustic device; and receiving second output sound at a second output measurement microphone, the second output sound emitted by the second acoustic device.

Item 63: The method of item 62, wherein:

the first and second device microphones are positioned inside a common sound chamber.

Item 64: The method of item 63, wherein the sound chamber is symmetric about the mirror plane.

Item 65: The method of any one of items 62-63, further comprising:

comparing the first output sound received at the first output measurement microphone and the second output sound received at the second output measurement microphone to the reference sound received at the first input reference microphone.

Item 66: The method of any one of items 62-65, further comprising:

receiving the reference sound at a second input reference microphone positioned proximate the second device microphone.

Item 67: The method of item 66, further comprising:

comparing the reference sound received at the first input reference microphone to the reference sound received at the second input reference microphone.

Item 68: The method of item 67, wherein said comparing comprises:

for each of a plurality of sound frequencies, comparing an amplitude of that frequency in the reference sound received at the first input reference microphone to an amplitude of that frequency in the reference sound received at the second input reference microphone.

Item 69: The method of item 66, further comprising:

determining whether a difference in the reference sound received at the first input reference microphone compared to the reference sound received at the second input reference microphone exceeds a first predetermined threshold.

Item 70: The method of item 66, further comprising:

displaying an error notification in response to determining that the difference in the reference sound received at the first input reference microphone compared to the reference sound received at the second input reference microphone exceeds a first predetermined threshold.

Item 71: The method of item 66, wherein:

the first predetermined difference is an amplitude of 2.5 decibels in one or more frequencies of the reference sound.

Item 72: The method of item 70, wherein said displaying the error notification comprises controlling illumination of an error light.

Item 73: The method of item 70, wherein said displaying the error notification comprises sending control signals to a display device.

Item 74: The method of any one of items 66-73, further comprising:

determining whether a difference in the reference sound received at the first input reference microphone compared to the reference sound received at the second input reference microphone is below a second predetermined threshold.

Item 75: The method of item 62, further comprising:

receiving the reference sound at a second input reference microphone positioned proximate the second device microphone; and comparing the first output sound received at the first output measurement microphone and the second output sound received at the second output measurement microphone to an average of the reference sound received at the first and second input reference microphones, in response to determining that a difference in the reference sound received at the first input reference microphone compared to the reference sound received at the second input reference microphone is below a second predetermined threshold.

Item 76: The method of any one of items 62-75, wherein:

the reference sound generated by the primary speaker generates a sound field that is substantially symmetric about the mirror plane.

Item 77: The method of any one of items 62-76, further comprising:

positioning the first and second device microphones substantially symmetrically on opposite sides of the mirror plane and substantially equidistant from the primary speaker.

Item 78: The method of item 77, wherein:

said positioning comprises mounting the first and second acoustic devices to a binaural test fixture.

Item 79: The method of any one of items 66-74, further comprising:

positioning the first input reference microphone within 5 mm of the first device microphone; and positioning the second input reference microphone within 5 mm of the second device microphone.

Item 80: The method of any one of items 62-79, further comprising:

positioning a first device speaker of the first acoustic device to emit the first output sound into a first sound test cavity; and positioning a second device speaker of the second acoustic device to emit the second output sound into a second sound test cavity.

The invention claimed is:

1. An acoustic device test fixture for carrying an acoustic device in a test apparatus, the acoustic device including a device speaker, the acoustic device test fixture comprising:

a fixture body having an output measurement microphone and an acoustic coupler mount; and an acoustic coupler body defining a sound test cavity, the sound test cavity having a lateral outer test cavity opening spaced laterally outwardly from a lateral inner test cavity opening, the sound test cavity having a sound test cavity centerline intersecting the lateral outer test cavity opening and the lateral inner test cavity opening, and the acoustic coupler body being removably connected to the acoustic coupler mount, wherein connecting the acoustic coupler body to the acoustic coupler mount comprises moving the acoustic coupler body relative to the acoustic coupler mount in a connection direction transverse to the sound test cavity centerline.

2. The acoustic device test fixture of claim 1, wherein:

the acoustic coupler body further comprises an acoustic device speaker mount proximate the lateral outer test cavity opening.

3. The acoustic device test fixture of claim 2, wherein:

the acoustic device speak mount comprises a device speaker opening aligned with the sound test cavity centerline.

4. The acoustic device test fixture of claim 1, wherein:

the acoustic coupler mount further comprises a sealing member, and the sealing member forms an acoustic seal with the acoustic coupler body when the acoustic coupler body is connected to the acoustic coupler mount.

5. The acoustic device test fixture of claim 4, wherein:

the acoustic coupler mount comprises an insertion slot that receives the acoustic coupler body when the acoustic coupler body is connected to the acoustic coupler mount, and connecting the acoustic coupler body to the acoustic coupler mount comprises sliding the acoustic coupler body into the insertion slot in the connection direction.

6. The acoustic device test fixture of claim 5, wherein:

the acoustic coupler mount comprises a seat, the seat carrying the sealing member, and the seat defining a lateral inner end of the insertion slot.

7. The acoustic device test fixture of claim 6, wherein:

the seat is laterally movable relative to a lateral outer end of the insertion slot.

8. The acoustic device test fixture of claim 7, wherein:

the seat is biased laterally outwardly towards the lateral outer end of the insertion slot.

9. The acoustic device test fixture of claim 6, wherein:

the acoustic coupler body comprises a spacer, and the spacer maintains separation between the sealing member and the acoustic coupler body during insertion of the acoustic coupler body into the insertion slot.

10. The acoustic device test fixture of claim 4, wherein:

the sealing member is laterally movable relative to the fixture body.

11. The acoustic device test fixture of claim 4, wherein:

when the acoustic coupler body is connected to the acoustic coupler mount, the sealing member is movable between an engaged position in which the sealing member forms an acoustic seal with the acoustic coupler body, and a disengaged position in which the sealing member is spaced apart from the acoustic coupler body.

12. The acoustic device test fixture of claim 11, wherein:

the sealing member is biased to the engaged position.

13. The acoustic device test fixture of claim 11, wherein:

the sealing member comprises an O-ring positioned in a sloped channel, the channel having an inside diameter that decreases in a lateral direction towards a lateral outer channel opening.

14. The acoustic device test fixture of claim 11, wherein: the acoustic coupler mount comprises at least one external grip that is manually user operable to move the sealing member towards the disengaged position.

15. The acoustic device test fixture of claim 10, wherein: the acoustic coupler body comprises a spacer, and the spacer inhibits the sealing member from moving to the engaged position when the acoustic coupler is moved out of connection with the acoustic coupler mount.

16. The acoustic device test fixture of claim 1, wherein: when the acoustic coupler body is connected to the acoustic coupler mount, the output measurement microphone is positioned proximate the lateral inner test cavity opening and aligned with the sound test cavity centerline.

17. An acoustic device test fixture for carrying an acoustic device in a test apparatus, the acoustic device including a device speaker, the acoustic device test fixture comprising:

a fixture body having an output measurement microphone and an acoustic coupler mount, the acoustic coupler mount defining a coupler body insertion slot; and an acoustic coupler body defining a sound test cavity, the sound test cavity extending in a lateral direction and having a lateral outer test cavity opening spaced laterally outwardly from a lateral inner test cavity opening, and wherein the acoustic coupler body is removably receivable in the coupler body insertion slot, and the coupler body insertion slot defines a coupler body insertion direction transverse to the lateral direction.

18. The acoustic device test fixture of claim 17, wherein: the coupler body insertion direction is perpendicular to the lateral direction.

19. The acoustic device test fixture of claim 17, wherein: when the acoustic coupler body is received in the coupler body insertion slot, the output measurement microphone is positioned laterally inwardly of the sound test cavity and proximate to the lateral inner test cavity opening.

20. The acoustic device test fixture of claim 19, wherein: the acoustic coupler body further comprises an acoustic device speaker mount proximate the lateral outer test cavity opening.

* * * * *